United States Patent
Sawamura et al.

(10) Patent No.: US 6,853,595 B2
(45) Date of Patent: Feb. 8, 2005

(54) SEMICONDUCTOR MEMORY DEVICE

(75) Inventors: Takahiro Sawamura, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 302 days.

(21) Appl. No.: 10/284,174

(22) Filed: Oct. 31, 2002

(65) Prior Publication Data

US 2003/0099136 A1 May 29, 2003

(30) Foreign Application Priority Data

Nov. 28, 2001  (JP) ........................................ 2001-362281

(51) Int. Cl.[7] .............................................. G11C 11/00
(52) U.S. Cl. ............. 365/195; 365/189.03; 365/189.01; 365/201
(58) Field of Search .......................... 365/195, 189.01, 365/189.03, 201

(56) References Cited

U.S. PATENT DOCUMENTS

| | | | | |
|---|---|---|---|---|
| 5,204,837 A | * | 4/1993 | Suwa et al. ................. | 365/201 |
| 5,712,180 A | * | 1/1998 | Guterman et al. .......... | 438/263 |
| 5,815,458 A | * | 9/1998 | Chevallier et al. ........ | 365/230.06 |
| 5,959,897 A | * | 9/1999 | Chevallier et al. ........ | 365/185.33 |
| 6,047,352 A | * | 4/2000 | Lakhani et al. ............. | 711/5 |
| 6,301,169 B1 | | 10/2001 | Kikuda et al. | |
| 6,330,180 B2 | * | 12/2001 | Noro et al. ................. | 365/145 |
| 6,421,789 B1 | * | 7/2002 | Ooishi ........................ | 714/7 |
| 6,452,859 B1 | * | 9/2002 | Shimano et al. ........... | 365/230.06 |
| 6,560,138 B2 | * | 5/2003 | Noro et al. ................. | 365/145 |
| 6,741,509 B2 | * | 5/2004 | Kato et al. .................. | 365/200 |

FOREIGN PATENT DOCUMENTS

| | | | | |
|---|---|---|---|---|
| EP | 1081714 A1 | | 3/2001 | |
| JP | 55157194 A | | 12/1980 | |
| JP | 409134600 A | * | 5/1997 | ........... G11C/29/00 |
| JP | 10079196 | | 3/1998 | |
| JP | 2001-143463 | | 5/2001 | |
| JP | 2002313099 | * | 10/2002 | ........... G11C/29/00 |

* cited by examiner

Primary Examiner—Viet Q. Nguyen
(74) Attorney, Agent, or Firm—Arent Fox PLLC

(57) ABSTRACT

A semiconductor memory device having a plurality of pair cells including a pair of cells for storing ordinary data and auxiliary data in which the operation of one cell in a pair cell can be checked. At normal operation time data can be read from or written to a desired cell by activating two word lines at a time. On the other hand, at operation test time data can be read from or written to only one cell in a pair cell by activating a desired word line.

12 Claims, 30 Drawing Sheets

| tes59 | extra add. z | 2/4 add. z | raq0z | raq1z | raq2z | raq3z |
|---|---|---|---|---|---|---|
| L | H or L | L | H | H | L | L |
| L | H or L | H | L | L | H | H |
| H | L | L | H | L | L | L |
| H | L | H | L | L | L | H |
| H | H | L | L | H | L | H |
| H | H | H | L | L | H | L |

FIG. 5

| tes59 | extra add. z | 2/4 add. z | raq0z | raq1z | raq2z | raq3z |
|---|---|---|---|---|---|---|
| L | H or L | L | H | L | H | L |
| L | H or L | H | L | H | L | H |
| H | L | L | H | L | L | L |
| H | L | H | L | L | L | H |
| H | H | L | L | H | H | L |
| H | H | H | L | H | L | L |

FIG. 11

| tes59z | block | extra address | bltux | bltuz | bltlx | bltlz |
|---|---|---|---|---|---|---|
| L | upper | L or H | H | H | L | L |
| | lower | L or H | L | L | H | H |
| H | upper | L | H | L | L | L |
| | | H | L | H | L | L |
| | lower | L | L | L | H | L |
| | | H | L | L | L | H |

FIG. 16

| tes59z | block | extra address | bltux | bltuz | bltlx | bltlz |
|---|---|---|---|---|---|---|
| L | upper | L or H | H | H | L | L |
| L | lower | L or H | L | L | H | H |
| H | upper | L | H | L | L | H |
| H | upper | H | L | H | H | L |
| H | lower | L | L | H | H | L |
| H | lower | H | H | L | L | H |

FIG. 23

SEMICONDUCTOR MEMORY DEVICE

CROSS REFFERENCE TO RELATED APPLICATIONS

This Application is based upon and claims priority of Japanese Patent Application No. 2001-362281, filed on Nov. 28, 2001, the contents being incorporated herein by reference.

BACKGROUND OF THE INVENTION (1) Field of the Invention

This invention relates to a semiconductor memory device and, more particularly, to a semiconductor memory device having a plurality of pair cells including a pair of cells for storing ordinary data and auxiliary data.

(2) Description of the Related Art

With semiconductor memory devices of a dynamic random access memory (DRAM) type including capacitors for accumulating electric charges and transistors for inputting data to and outputting data from them, refresh operation must be performed regularly to compensate for the leakage of electric charges from the capacitors. In such DRAM type semiconductor memory devices an electric current consumed at this refresh operation time will occupy a good part of an electric current consumed when they do not operate (when an operation is not performed from the outside and they are in an inactive state). Japanese Patent Laid-Open Publication No. 2001-143463 discloses accumulating electric charges by a twin storage system as an effective means of decreasing such a refresh current.

In this disclosure data to be stored is stored as complementary data in a pair of memory cells (hereinafter simply referred to as a cell) and the pair of memory cells are connected to a pair of bit lines connected to a common sense amplifier in response to the selection of a word line. That is to say, a pair of cells are located at the positions where a pair of bit lines connected to a sense amplifier and a word line intersect, and complementary data is written from the pair of bit lines to the pair of cells or is read out to the pair of bit lines by selecting the word line. "H" and "L" levels are stored in a pair of cells for 1-bit stored data. As a result, reading sensitivity improves and a refresh cycle can be lengthened significantly. Therefore, the amount of storage increases twofold, but an electric current consumed when DRAM type semiconductor memory devices do not operate can be decreased by reducing the number of times refresh operation is performed.

FIG. 28 is a view showing the concrete structure of a conventional twin-storage system semiconductor memory device. As shown in FIG. 28, a conventional twin-storage system semiconductor memory device comprises a row address pre-decoder 10, a main word decoder 11, an address pre-decoder 12, subword decoders #1 through #4, sense amplifiers 13-1 through 13-4, word lines WL1 through WL6, bit lines BL1 through BL8, and a cell array 14.

The row address pre-decoder 10 is a processing section at a stage just before them a in word decoder 11. The row address pre-decoder 10 inputs and decodes a row address, being an address in a row direction, and supplies a decode result to the main word decoder 11.

The main word decoder 11 further decodes a decode result supplied from the row address pre-decoder 10 and supplies a decode result to the subword decoders #1 through #4.

The address pre-decoder 12 accepts an input row address and supplies a result obtained by decoding it to the subword decoders #1 through #4. Moreover, at test operation time the address pre-decoder 12 accepts an input predetermined signal indicative of test operation.

The subword decoders #1 through #4 control the word lines WL2 through WL5, respectively, on the basis of decode results supplied from the main word decoder 11 and address pre-decoder 12.

The sense amplifiers 13-1 through 13-4 amplify data read from a cell included in the cell array 14.

As shown in FIG. 29, the cell array 14 includes a plurality of cell units C11 through C82 described later.

FIG. 30 is a view showing the detailed structure of the cell units C11 through C82 shown in FIG. 29. As shown in FIG. 30, a cell unit includes cells 30 and 31, gates 32 and 33, and a contact 34.

The cells 30 and 31 are basic units for recording data and hold bit information.

The gates 32 and 33 are connected to the word lines WL1 and WL2 respectively. The gate 32 connects the cell 30 and bit line BL2 according to voltage applied to the word line WL1 and the gate 33 connects the cell 31 and bit line BL2 according to voltage applied to the word line WL2.

The contact 34 supplies data read from the cell 30 or 31 to the bit line BL2 and supplies data applied to the bit line BL2 to the cell 30 or 31.

Now, operation in the above conventional twin-storage system semiconductor memory device will be described in brief with reading operation as an example.

When a row address is input, the word line WL3 will be activated if the subword decoder #2, for example, is selected by the operation of the row address pre-decoder 10, main word decoder 11, and address pre-decoder 12.

When the word line WL3 is activated, voltage will be applied to gates for controlling the upper cells in the cell units C11, C31, C51, and C71 and bit signals stored in these cells are read out.

The bit signals read out from these cells are supplied to the bit lines BL1, BL3, BL5, and BL7 respectively. The bit signals output to the bit lines BL1 and BL3 are supplied to the sense amplifier 13-1 and the bit signals output to the bit lines BL5 and BL7 are supplied to the sense amplifier 13-2. The bit lines BL1 and BL3 are used for sending ordinary data and auxiliary data respectively, so the logic of the bit signal output to the bit line BL1 is reverse to that of the bit signal output to the bit line BL3. The bit lines BL5 and BL7 are also used for sending ordinary data and auxiliary data respectively, so the logic of the bit signal output to the bit line BL5 is reverse to that of the bit signal output to the bit line BL7.

The sense amplifier 13-1 amplifies the signals output from the bit lines BL1 and BL3, specifies stored data by referring to amplified signals, and outputs specified results.

Similarly, the sense amplifier 13-2 amplifies the signals output from the bit lines BL5 and BL7, specifies stored data by referring to amplified signals, and outputs specified results.

With this system, a refresh cycle can be lengthened only if not only a cell which connects with a bit line (BL1, BL2, BL5, or BL6) for transmitting ordinary data but also a cell which connects with an auxiliary bit line (BL3, BL4, BL7, or BL8) for transmitting auxiliary data has no defect and can accumulate electric charges. However, there are cases where one cell cannot accumulate electric charges due to a defect and where the other cell can accumulate electric charges. In these cases, as a result of an operation test a pair of cells may appear to operate normally.

In that case, however, only one cell accumulates electric charges, so the refresh capability is much the same with a single storage cell. A refresh cycle for a device is set to cells of all the cells which have bad refresh characteristics. Therefore, if a pair of cells in which only one cell operates exist in a device, a refresh cycle must be shortened to them. As a result, the effect of lengthening a refresh cycle by adopting a twin storage system cannot be obtained.

SUMMARY OF THE INVENTION

The present invention was made under the background circumstances as described above. An object of the present invention is to provide a semiconductor memory device having the functions of detecting a cell unit in which only one cell has a defect in an operation test and of remedying it by using a redundant cell.

In order to achieve the above object, a semiconductor memory device having a plurality of pair cells including a pair of cells for storing ordinary data and auxiliary data is provided. This semiconductor memory device comprises word lines for selecting a predetermined pair cell, bit lines for reading data from and writing data to a pair cell selected by the word lines, an operation mode input circuit for accepting a setting signal input to set an operation mode, and a restriction circuit for putting restrictions on reading data from and writing data to one cell of the pair cell in the case of a setting signal indicative of setting to a mode in which an operation test is performed on a cell being input from the operation mode input circuit.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 5 is a view for describing the operation of the circuit shown in FIG. 2.

FIG. 11 is a view for describing the operation of the circuit shown in FIG. 10.

FIG. 16 is a view for describing the operation of the BT control circuit shown in FIG. 13.

FIG. 23 is a view for describing the operation of the BT control circuit shown in FIG. 20.

DESCRIPTION OF THE PREFERRED EMBODIMENTS

Figure 1:
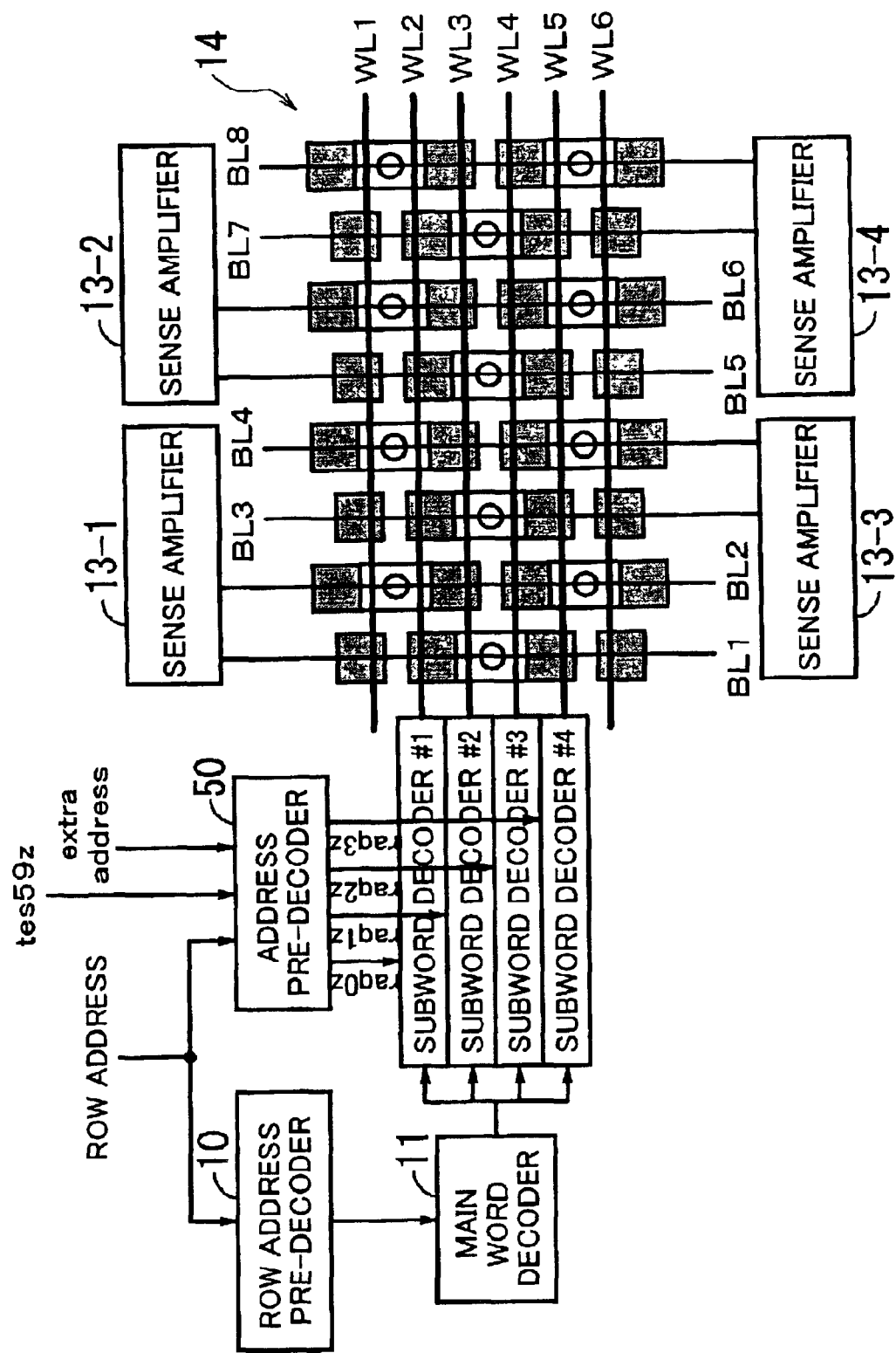
FIG. 1 is a view showing the structure of a first embodiment of the present invention.

Embodiments of the present invention will now be described with reference to the drawings. FIG. 1 is a view showing the structure of an embodiment of the present invention. As shown in FIG. 1, a semiconductor memory device according to an embodiment of the present invention comprises a row address pre-decoder 10, a main word decoder 11, an address pre-decoder 50, subword decoders #1 through #4, sense amplifiers 13-1 through 13-4, word lines WL1 through WL6, bit lines BL1 through BL8, and a cell array 14. In this embodiment only part of the semiconductor memory device is illustrated to give a simple description.

The row address pre-decoder 10 is a processing section at a stage just before the main word decoder 11. The row address pre-decoder 10 inputs and decodes a row address, being an address in a row direction, and supplies a decode result to the main word decoder 11.

The main word decoder 11 further decodes a decode result supplied from the row address pre-decoder 10 and supplies a decode result to the subword decoders #1 through #4.

The address pre-decoder 50 accepts an input row address, extra address signal, and tes59z signal and supplies results obtained by decoding them to the subword decoders #1 through #4.

Figure 2:
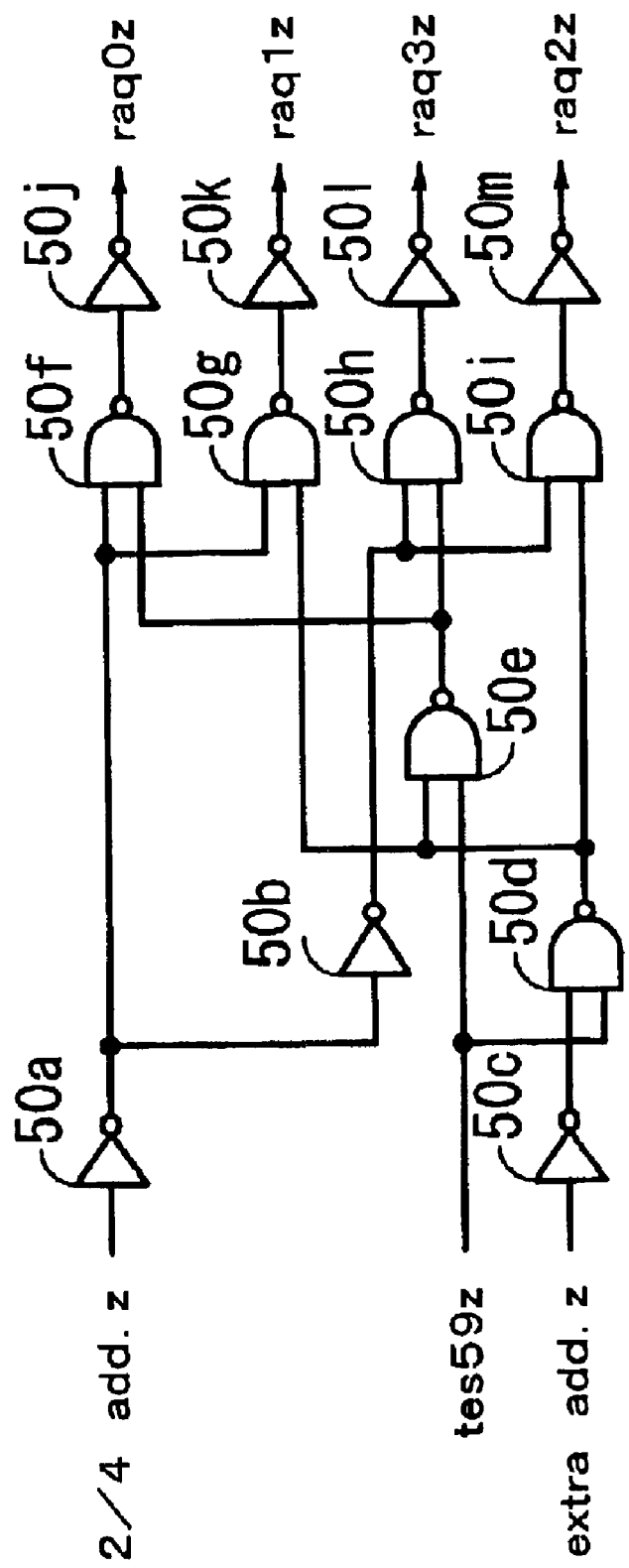
FIG. 2 is a view showing the detailed structure of the address pre-decoder shown in FIG. 1.

FIG. 2 is a view showing the detailed structure of the address pre-decoder 50. As shown in FIG. 2, the address pre-decoder 50 includes inverters 50a through 50c and 50j through 50m and NAND elements 50d through 50i.

A 2/4 add. z signal is a row address signal. A tes59z signal is in the "L" state at normal operation time and is in the "H"

state at operation test time. An extra add. z signal indicates which of a bit line (BL1, BL3, BL5, or BL7) and auxiliary bit line (BL2, BL4, BL6, or BL8) should be selected.

A raq0z signal, raq1z signal, raq3z signal, and raq2z signal output from the inverters 50j through 50m, respectively, are supplied to the subword decoders #1, #2, #4, and #3 respectively.

To return to FIG. 1, the subword decoders #1 through #4 control the word lines WL2 through WL5, respectively, on the basis of decode results supplied from the main word decoder 11 and address pre-decoder 50.

The sense amplifiers 13-1 through 13-4 amplify data read from a cell included in the cell array 14.

Figure 3:
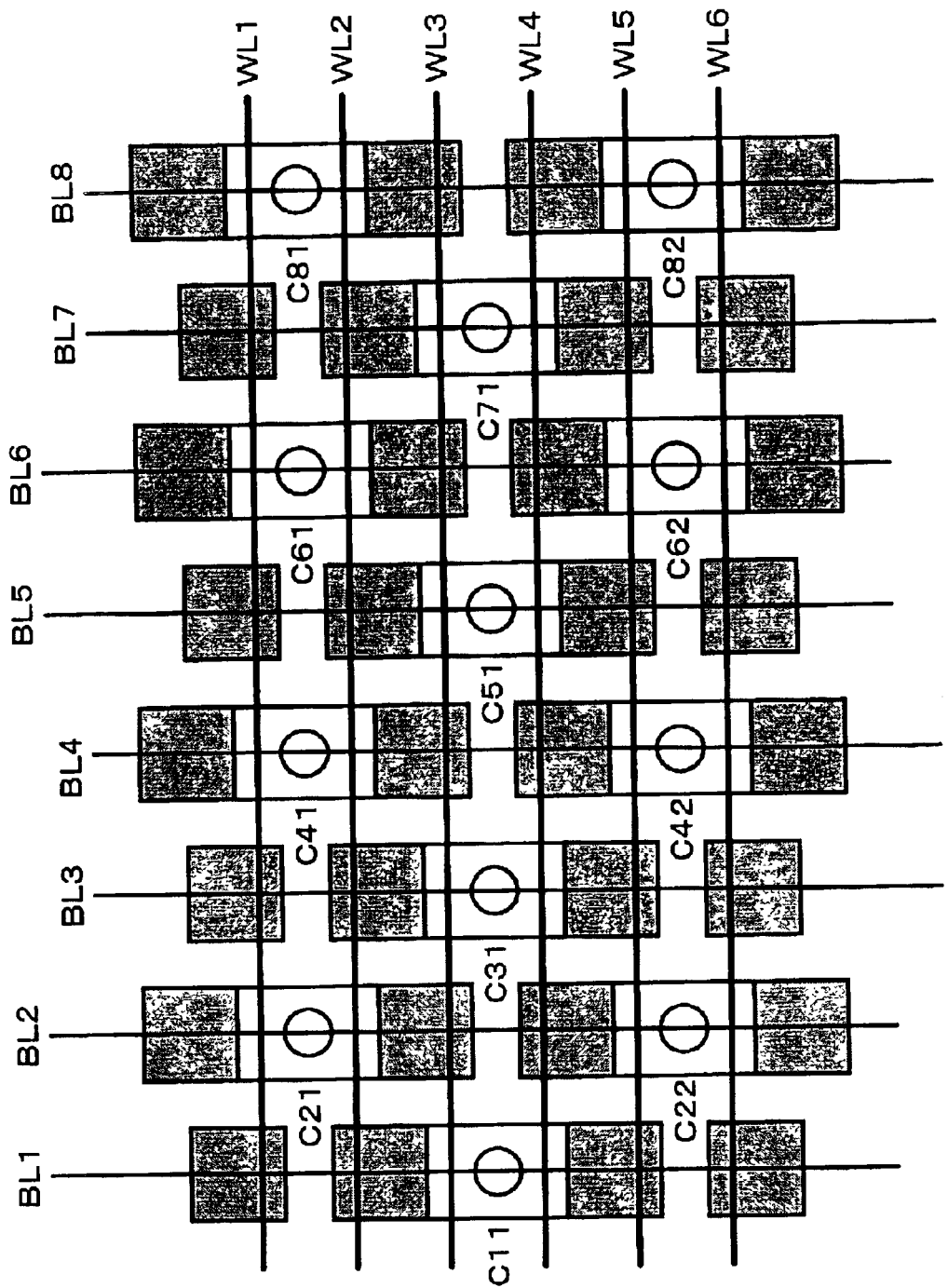
FIG. 3 is a view showing the detailed structure of the cell array shown in FIG. 1.

As shown in FIG. 3, the cell array 14 includes a plurality of cell units C11 through C82 described later.

Figure 4:
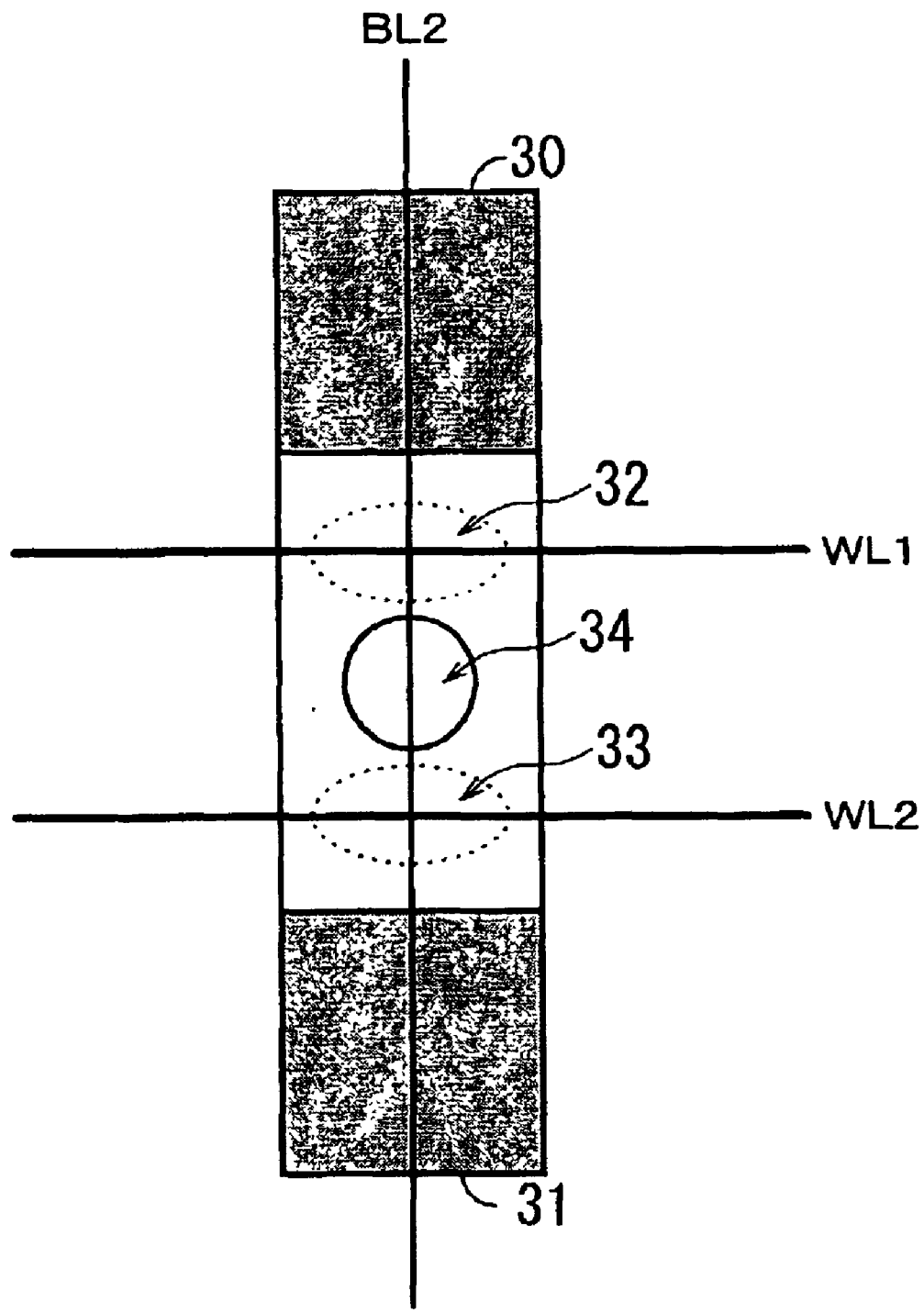
FIG. 4 is a view showing the detailed structure of the cell units shown in FIG. 3.

FIG. 4 is a view showing the detailed structure of the cell units C11 through C82 shown in FIG. 3. As shown in FIG. 4, the cell unit C21 includes cells 30 and 31, gates 32 and 33, and a contact 34.

The cells 30 and 31 are basic units for recording data and hold bit information.

The gates 32 and 33 are connected to the word lines WL1 and WL2 respectively. The gate 32 reads data from the cell 30 according to voltage applied to the word line WL1 and the gate 33 reads data from the cell 31 according to voltage applied to the word line WL2.

The contact 34 supplies data read from the cell 30 or 31 to the bit line BL2 and supplies data applied to the bit line BL2 to the cell 30 or 31.

This embodiment differs from conventional twin-storage system semiconductor memory devices in how to connect the bit lines BL1 through BL8 to the sense amplifiers 13-1 through 13-4 and how to activate the word lines WL1 through WL6. That is to say, in conventional twin-storage system semiconductor memories alternate bit lines are connected to the same sense amplifier, but in this embodiment two adjacent bit lines are connected to the same sense amplifier. How to activate the word lines WL1 through WL6 will be described later.

Now, operation in the above embodiment will be described.

(1) Normal Operation

A tes59z signal is in the "L" state at normal operation time. Therefore, as shown in FIG. 5, the state of raq0Z through raq3z signals will change according to the state of a 2/4 add. z signal regardless of the state of an extra add. z signal.

Figure 6:
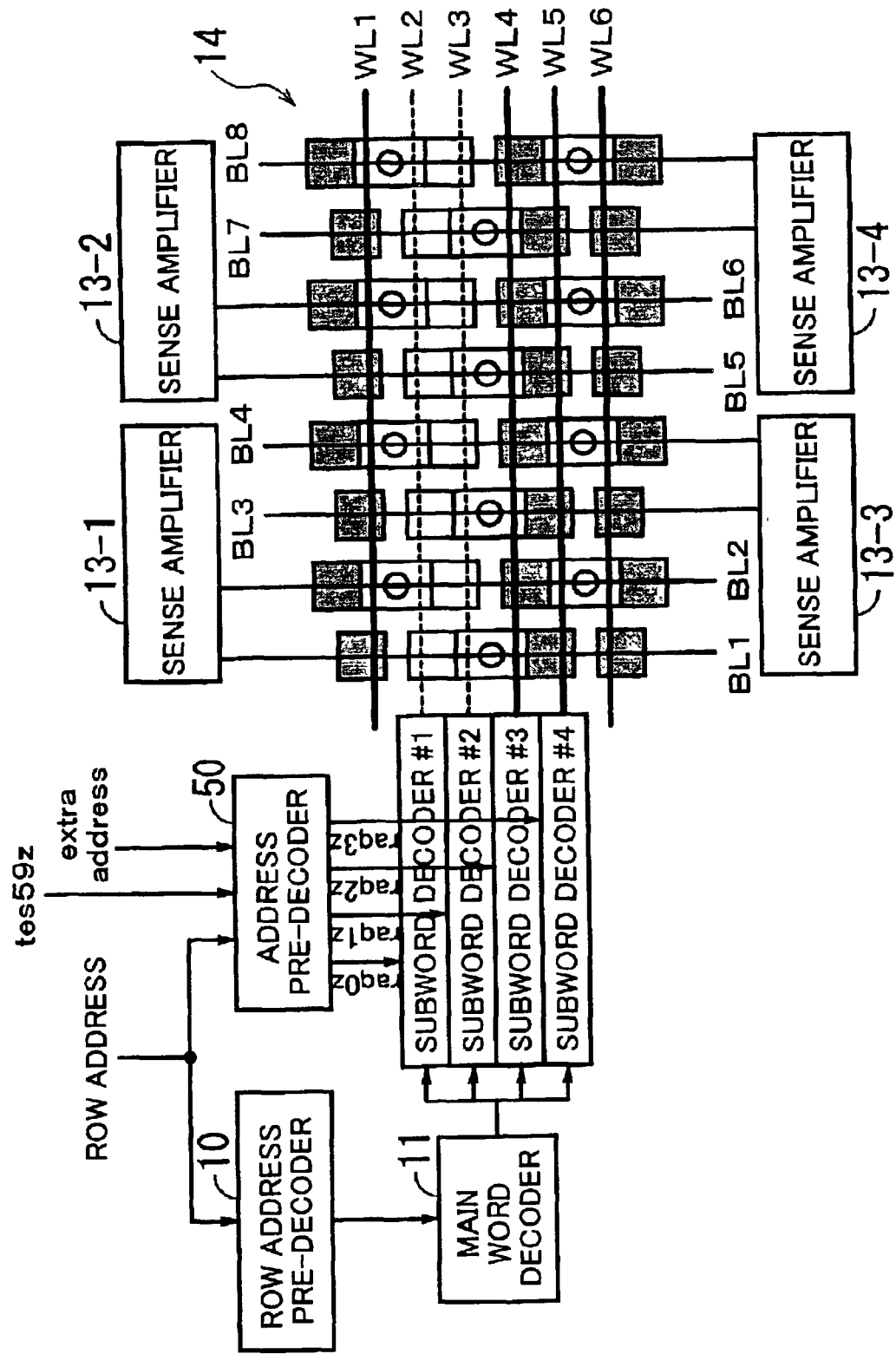
FIG. 6 is a view for describing the operation at normal time of the embodiment shown in FIG. 1.

That is to say, as shown in FIG. 5, when a 2/4 add. z signal is in the "L" state, raq0Z and raq1z signals go into the "H" state and raq2Z and raq3z signals go into the "L" state. As a result, as shown in FIG. 6, the word lines WL2 and WL3 become active (each dashed line in FIG. 6 indicates an active state) and white cells (not painted out) go into a selected state.

Figure 7:
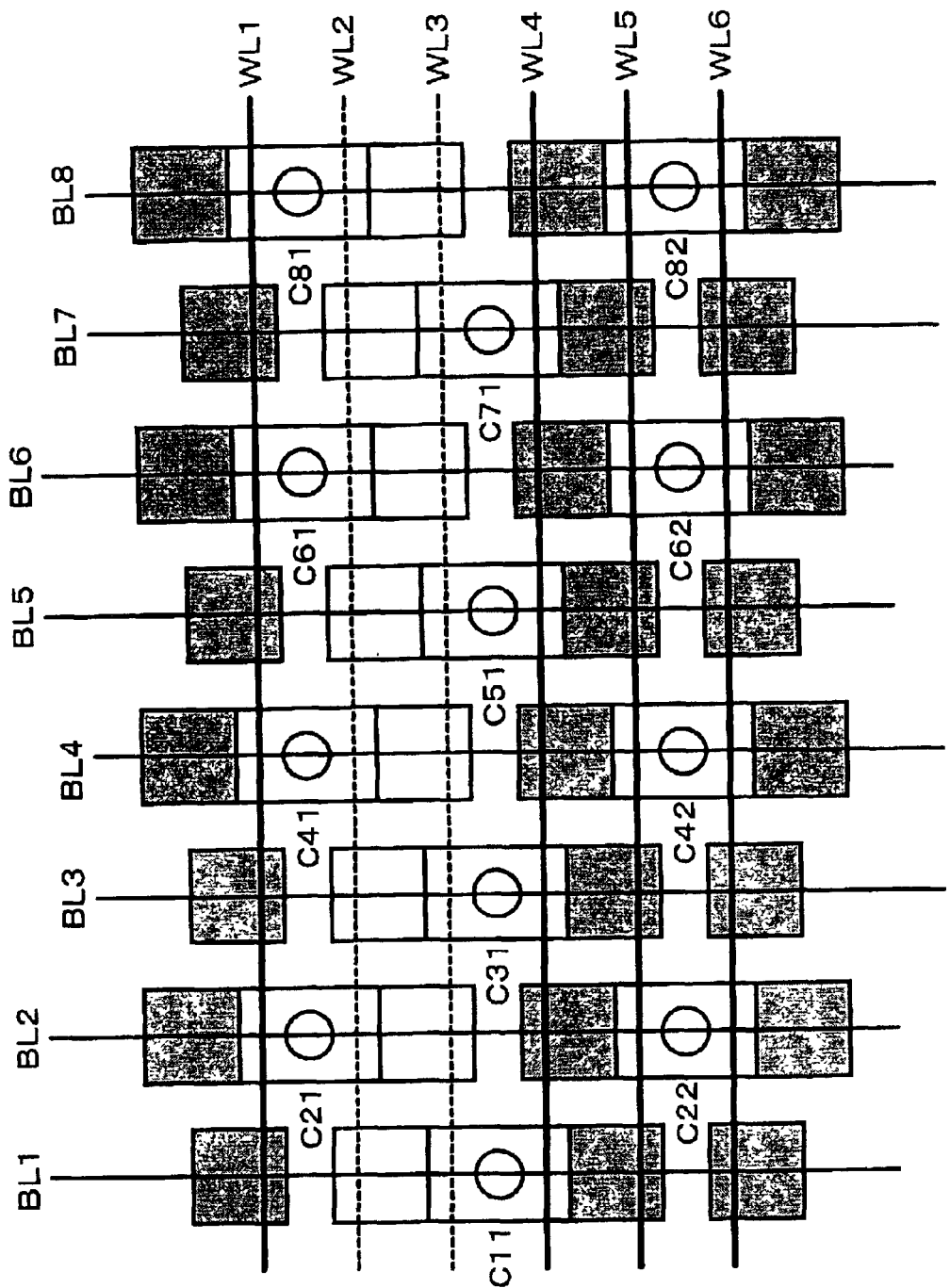
FIG. 7 is an enlarged view of the cell array shown in FIG. 6.

FIG. 7 is an enlarged view showing the state at this time of the cell array. As shown in FIG. 7, when the word lines WL2 and WL3 become active, the upper cell in the cell unit C11 and the lower cell in the cell unit C21, for example, are selected and are connected to the bit lines BL1 and BL2 respectively. These cells store ordinary data and auxiliary data respectively (two cells which store ordinary data and auxiliary data respectively will be referred to as a "pair cell" in this specification), so the ordinary data and auxiliary data will be supplied to the sense amplifier 13-1.

On the other hand, when a 2/4 add. z signal is in the "H" state, raq0Z and raq1z signals go into the "L" state and raq2Z and raq3z signals go into the "H" state. As a result, the word lines WL4 and WL5 become active.

When the word lines WL4 and WL5 become active, the lower cell in the cell unit C11 and the upper cell in the cell unit C22, for example, are selected and are connected to the bit lines BL1 and BL2 respectively. These cells make up a pair cell which stores ordinary data and auxiliary data, so the ordinary data and auxiliary data will be supplied to the sense amplifier 13-1.

The above operation will also be performed on the other cells, so ordinary data and auxiliary data are read from cells selected by word lines and are supplied to the sense amplifiers 13-1 through 13-4.

(2) Test Operation

Figure 8:
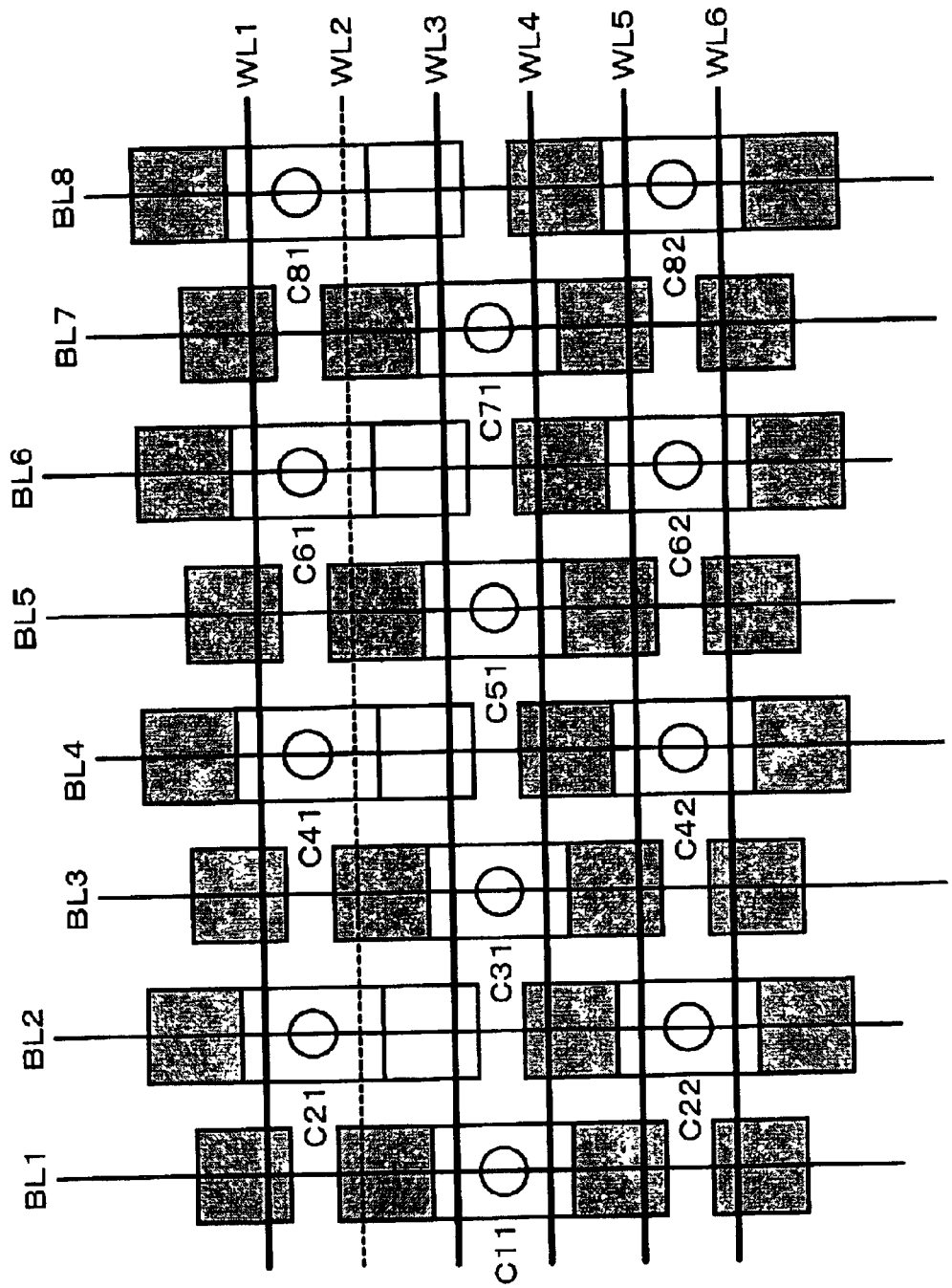
FIG. 8 is a view for describing the operation at operation test time of the embodiment shown in FIG. 1.

At test operation time a tes59z signal is put into the "H" state and an extra add. z signal is put into the "H" or "L" state according to a cell to be checked. It is assumed that an extra add. z signal is in the "L" state. As shown in FIG. 5, when a 2/4 add. z signal is in the "L" state, a raq0Z signal goes into the "H" state and raq1z, raq2Z, and raq3z signals go into the "L" state. As a result, only the word line WL2 goes into the "H" state and, as shown in FIG. 8, the lower cells in the cell units C21, C41, C61, and C81 are selected and are connected to the bit lines BL2, BL4, BL6, and BL8, being auxiliary bit lines, respectively. Therefore, whether or not selected cells are normal can be judged by writing predetermined data via these bit lines and then reading it again. Of a pair cell which stores ordinary data and auxiliary data, only a cell which stores the auxiliary data can be selected. As a result, even if only one cell of a pair cell is abnormal, it can be detected.

As shown in FIG. 5, when an extra add. z signal is in the "L" state and a 2/4 add. z signal is in the "H" state, a raq3z signal alone goes into the "H" state and the word line WL5 is activated. As a result, the upper cells in the cell units C22, C42, C62, and C82 are selected and are connected to the bit lines BL2, BL4, BL6, and BL8, all of which are auxiliary bit lines, respectively.

As shown in FIG. 5, when an extra add. z signal is in the "H" state and a 2/4 add. z signal is in the "L" state, a raq1z signal alone goes into the "H" state and the word line WL3 is activated. As a result, the upper cells in the cell units C11, C31, C51, and C71 are selected and are connected to the bit lines BL1, BL3, BL5, and BL7, all of which are ordinary bit lines, respectively.

As shown in FIG. 5, when an extra add. z signal is in the "H" state and a 2/4 add. z signal is in the "H" state, a raq2z signal alone goes into the "H" state and the word line WL4 is activated. As a result, the lower cells in the cell units C11, C31, C51, and C71 are selected and are connected to the bit lines BL1, BL3, BL5, and BL7, all of which are ordinary bit lines, respectively.

Now, a second embodiment of the present invention will be described.

Figure 9:
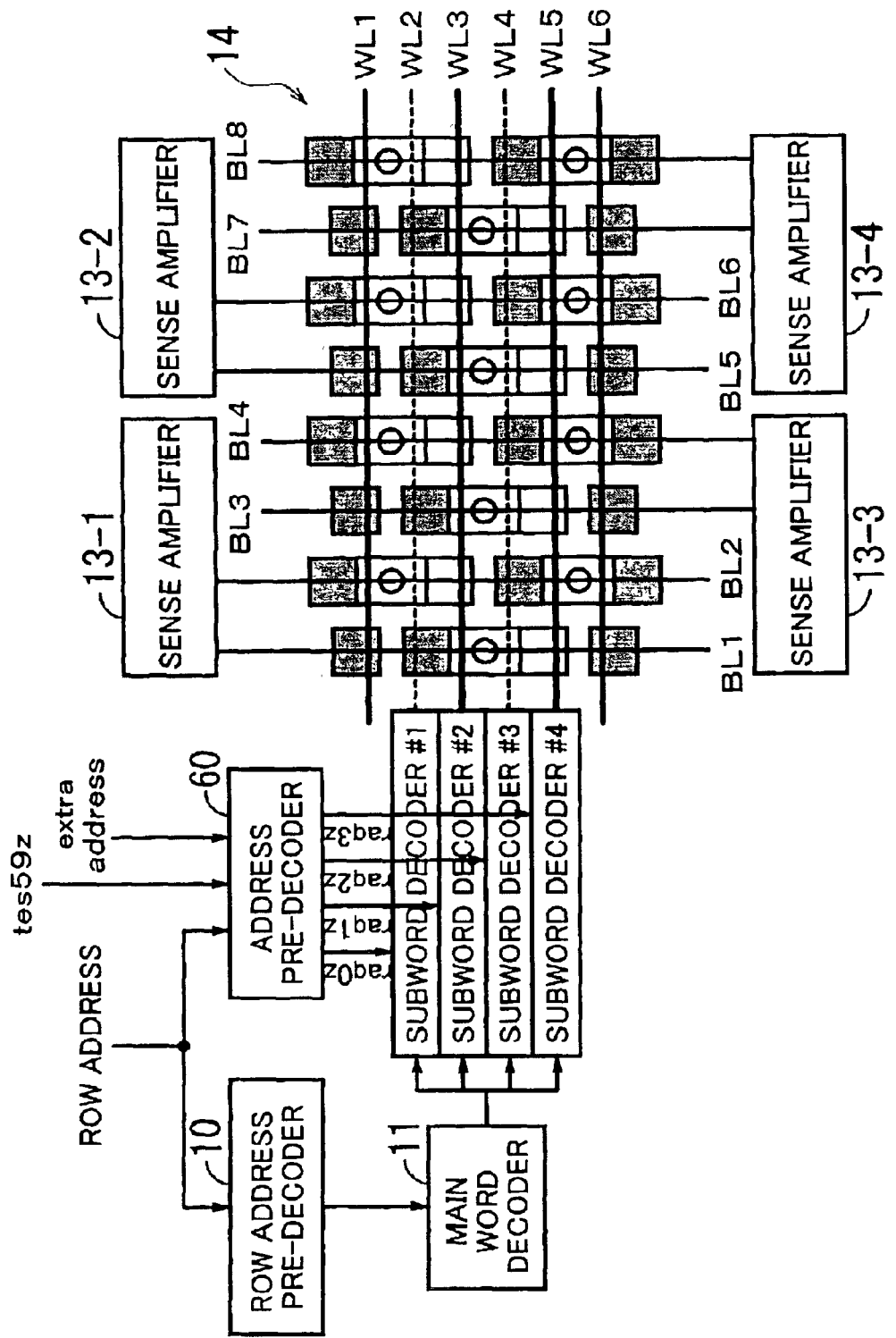
FIG. 9 is a view showing the structure of a second embodiment of the present invention.

FIG. 9 is a view showing the structure of a second embodiment of the present invention. Sections in FIG. 9 which are the same as those in FIG. 1 are marked with the same symbols and descriptions of them will be omitted.

In this embodiment the address pre-decoder 50 in FIG. 1 is replaced by an address PRE-decoder 60. Moreover, the second embodiment differs from the first embodiment in how to activate word lines. The structure of the second embodiment is the same as that of the first embodiment except the above.

Figure 10:
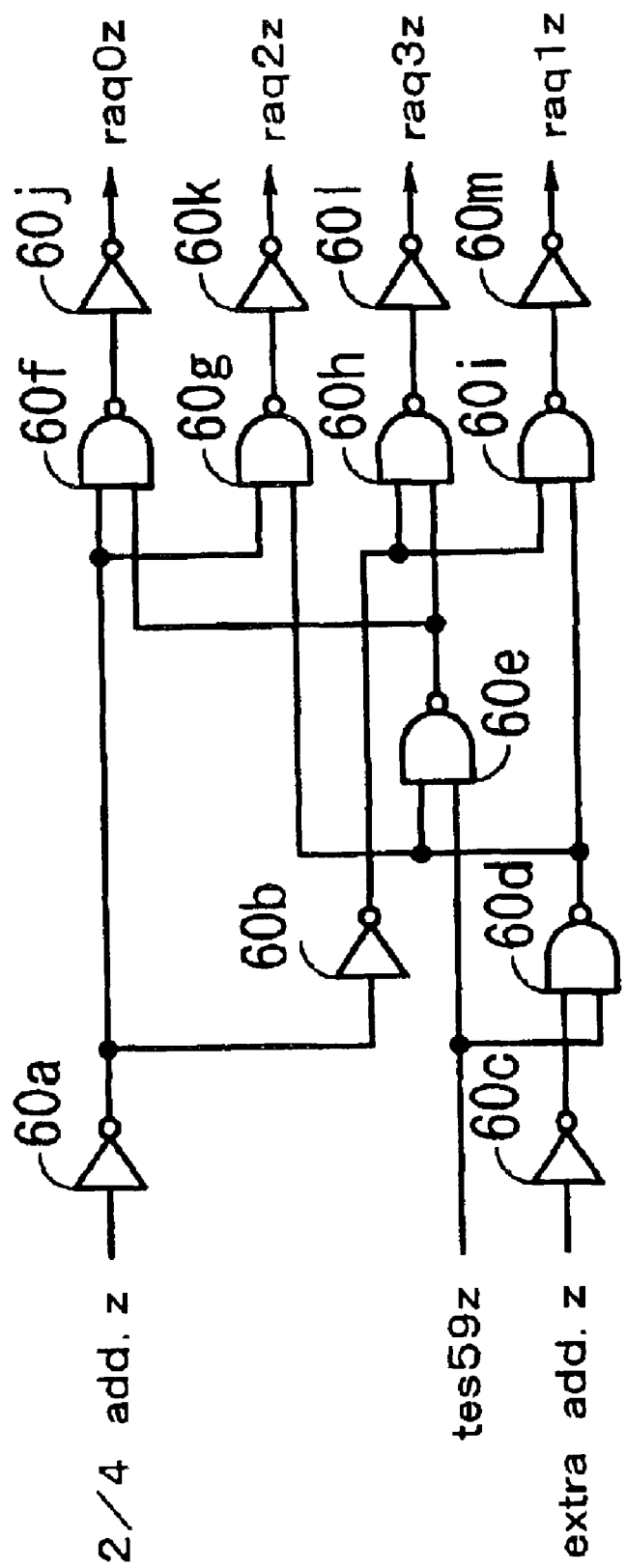
FIG. 10 is a view showing the detailed structure of the address pre-decoder shown in FIG. 9.

FIG. 10 is a view showing the detailed structure of the address pre-decoder 60. As shown in FIG. 10, the address pre-decoder 60 includes inverters 60a through 60c and 60j through 60m and NAND elements 60d through 60i. In FIG. 10, signals output from the inverters 60j through 60m are supplied to the subword decoders #1, #3, #4, and #2 respectively. This differs from the case of FIG. 2. The structure of the address pre-decoder 60 is the same as that of the address pre-decoder 50 shown in FIG. 2 except the above.

Now, operation in the second embodiment of the present invention will be described.

(1) Normal Operation

A tes59z signal is in the "L" state at normal operation time. Therefore, as shown in FIG. 11, the state of raq0Z through raq3z signals will change according to the state of a 2/4 add. z signal regardless of the state of an extra add. z signal.

That is to say, as shown in FIG. 11, when a 2/4 add. z signal is in the "L" state, raq0Z and raq2z signals go into the "H" state and raq1Z and raq3z signals go into the "L" state. As a result, as shown in FIG. 9, the word lines WL2 and WL4 become active (each dashed line in FIG. 9 indicates an active state) and white cells (not painted out) go into a selected state.

Figure 12:
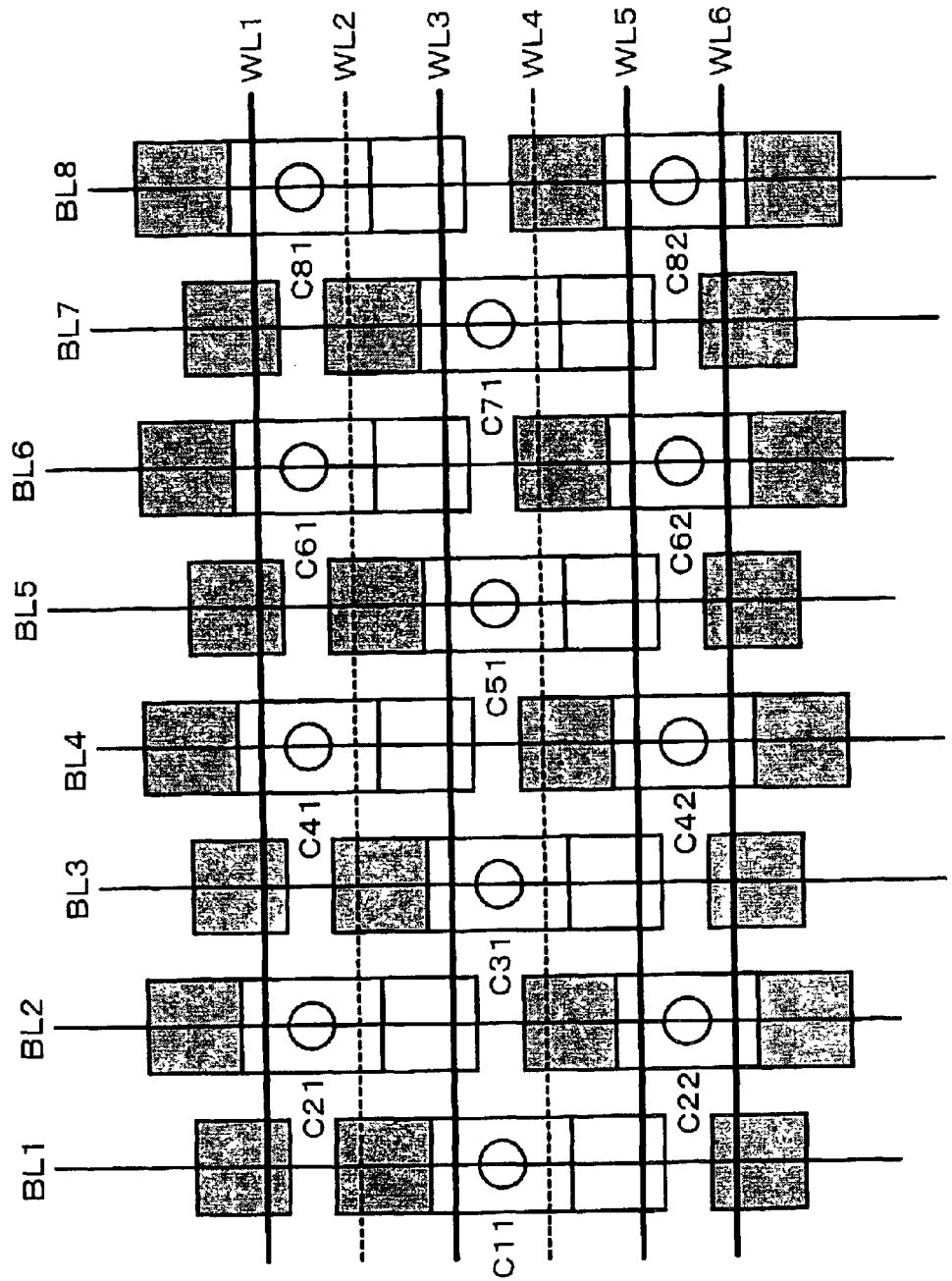
FIG. 12 is a view for describing the operation at normal time of the embodiment shown in FIG. 9.

FIG. 12 is an enlarged view showing the state at this time of the cell array. As shown in FIG. 12, when the word lines WL2 and WL4 become active, the lower cell in the cell unit C11 and the lower cell in the cell unit C21, for example, are selected and are connected to the bit lines BL1 and BL2 respectively. These cells make up a pair cell which stores ordinary data and auxiliary data, so the ordinary data and auxiliary data will be supplied to the sense amplifier 13-1.

On the other hand, when a 2/4 add. z signal is in the "H" state, raq0Z and raq2z signals go into the "L" state and raq1Z and raq3z signals go into the "H" state. As a result, the word lines WL3 and WL5 become active.

When the word lines WL3 and WL5 become active, the upper cell in the cell unit C11 and the upper cell in the cell unit C22, for example, are selected and are connected to the bit lines BL1 and BL2 respectively. These cells make up a pair cell which stores ordinary data and auxiliary data, so the ordinary data and auxiliary data will be supplied to the sense amplifier 13-1.

The above operation will also be performed on the other cells, so ordinary data and auxiliary data are read from cells selected by word lines and are supplied to the sense amplifiers 13-1 through 13-4.

By the way, compared with the first embodiment, the second embodiment will improve in breakdown voltage characteristic. That is to say, in the first embodiment shown in FIG. 7, selected pair cells (cells not painted out) are arranged near to one another at normal operation time. By contrast, in the second embodiment shown in FIG. 12, selected pair cells are arranged far from one another. The second embodiment therefore will improve in breakdown voltage characteristic.

In the second embodiment of the present invention, however, a word line not activated is between a pair of activated word lines (the word line WL3 between the word lines WL2 and WL4 shown in FIG. 12, for example), so there is the demerit of the word line not activated being subject to the influence of the pair of activated word lines. There is no such demerit in the first embodiment shown in FIG. 1.

(2) Test Operation

At test operation time a tes59z signal is put into the "H" state and an extra add. z signal is put into the "H" or "L" state according to a cell to be checked. It is assumed that an extra add. z signal is in the "L" state. As shown in FIG. 11, when a 2/4 add. z signal is in the "L" state, a raq0Z signal goes into the "H" state and raq1z, raq2Z, and raq3z signals go into the "L" state. As a result, only the word line WL2 goes into the "H" state and the lower cells in the cell units C21, C41, C61, and C81 are selected and are connected to the bit lines BL2, BL4, BL6, and BL8, all of which are auxiliary bit lines, respectively. Therefore, whether or not selected cells are normal can be judged by writing predetermined data via these bit lines and then reading it again. Of a pair cell which stores ordinary data and auxiliary data, only a cell which stores the auxiliary data can be selected. As a result, even if only one cell of a pair cell is abnormal, it can be detected.

As shown in FIG. 11, when an extra add. z signal is in the "L" state and a 2/4 add. z signal is in the "H" state, a raq3z signal alone goes into the "H" state and the word line WL5 is activated. As a result, the upper cells in the cell units C22, C42, C62, and C82 are selected and are connected to the bit lines BL2, BL4, BL6, and BL8, all of which are auxiliary bit lines, respectively.

As shown in FIG. 11, when an extra add. z signal is in the "H" state and a 2/4 add. z signal is in the "L" state, a raq2z signal alone goes into the "H" state and the word line WL4 is activated. As a result, the lower cells in the cell units C11, C31, C51, and C71 are selected and are connected to the bit lines BL1, BL3, BL5, and BL7, all of which are ordinary bit lines, respectively.

As shown in FIG. 11, when an extra add. z signal is in the "H" state and a 2/4 add. z signal is in the "H" state, a raq1z signal alone goes into the "H" state and the word line WL3 is activated. As a result, the upper cells in the cell units C11, C31, C51, and C71 are selected and are connected to the bit lines BL1, BL3, BL5, and BL7, all of which are ordinary bit lines, respectively.

Whether or not each of cells which make up a pair cell operates normally can be checked by the above operation, that is to say, by selecting only one cell of the pair cell, writing data to it, reading out the data from it again, and checking the data.

Now, a third embodiment of the present invention will be described.

Figure 13:
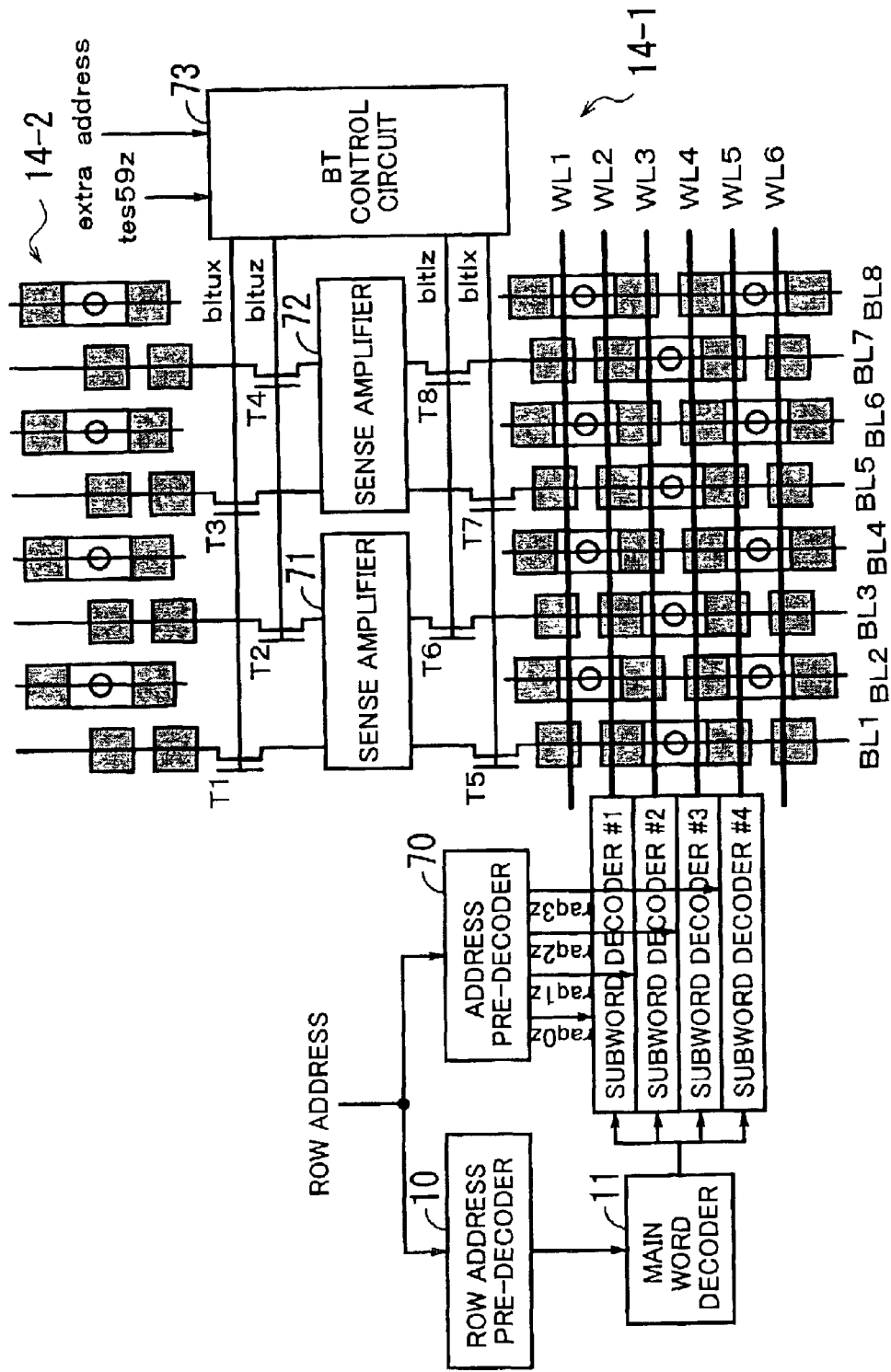
FIG. 13 is a view showing the structure of a third embodiment of the present invention.

FIG. 13 is a view showing the structure of a third embodiment of the present invention. The differences between the first embodiment shown in FIG. 1 and the third embodiment are as follows. The address pre-decoder 50 is replaced by an address pre-decoder 70. Sense amplifiers 71 and 72 read out data both from a cell array 14-1 and from a cell array 14-2. Furthermore, transistors T1 through T8 and a BT control circuit 73 are newly added.

The address pre-decoder 70 inputs and decodes a row address and selects the appropriate subword decoder from among the subword decoders #1 through #4 on the basis of a decode result.

The sense amplifiers 71 and 72 amplify data read out from the cell array 14-1 under them and the cell array 14-2 above them and output it.

The transistors T1 through T8 are put into the ON or OFF state under the control of the BT control circuit 73 to connect the sense amplifiers 71 and 72 to the cell arrays 14-1 and 14-2 or to disconnect the sense amplifiers 71 and 72 from the cell arrays 14-1 and 14-2.

When a tes59z signal goes into the "H" state, the BT control circuit 73 activates one of bltux, bltuz, bltlz, and bltlx signals according to an extra address signal to put the corresponding transistor into the OFF state.

Figure 14:
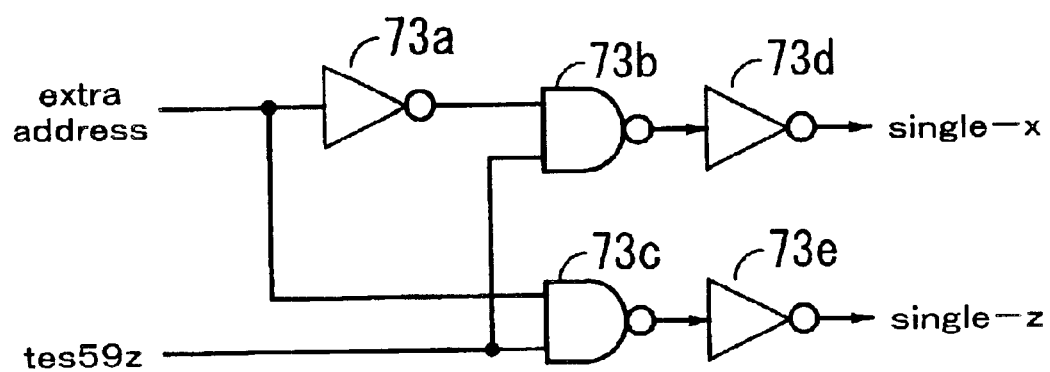
FIG. 14 is a view showing the structure of the BT control circuit shown in FIG. 13.
Figure 15:
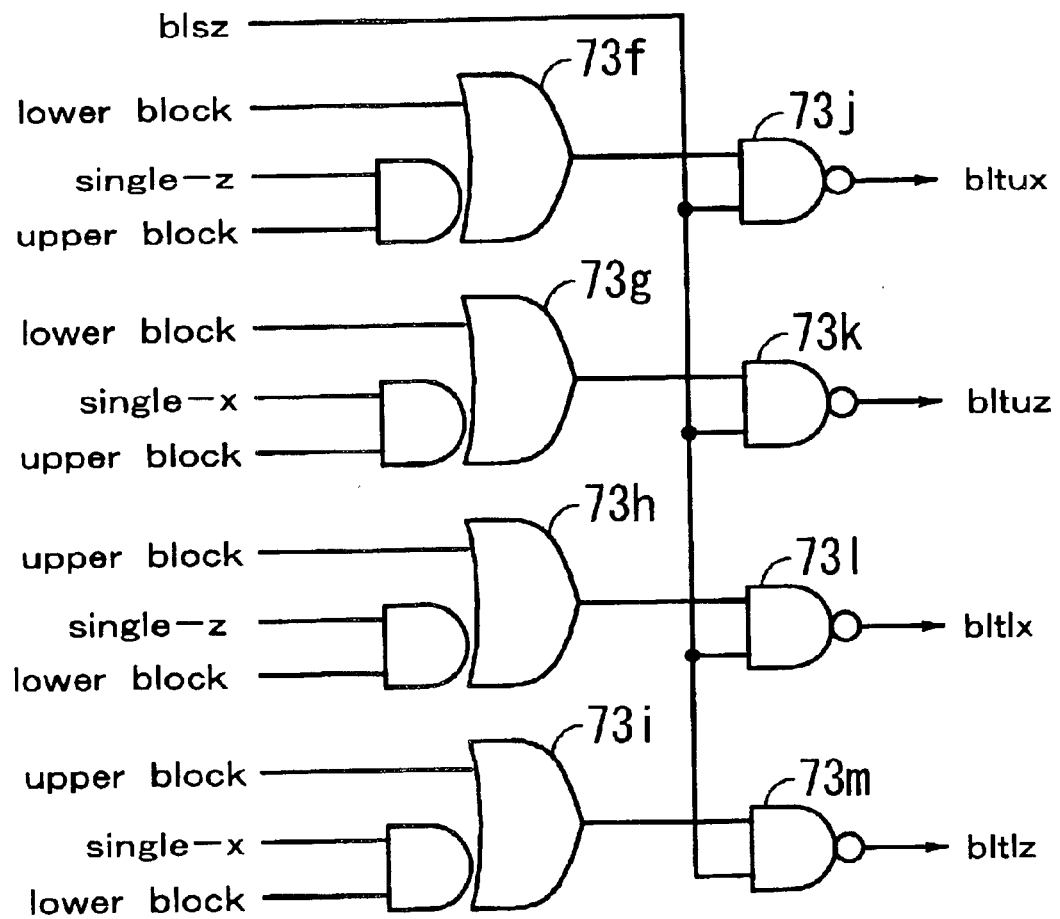
FIG. 15 is a view showing the structure of the BT control circuit shown in FIG. 13.

FIGS. 14 and 15 are views showing the detailed structure of the BT control circuit 73. FIG. 14 is a view showing a circuit for generating a single-x signal and single-z signal. This circuit includes inverters 73a, 73d, and 73e and NAND elements 73b and 73c. This circuit generates a single-x signal and single-z signal from an extra address signal and tes59z signal and outputs them.

FIG. 15 is a view showing the other component of the BT control circuit 73. This circuit includes AND-OR elements 73f through 73i and NAND elements 73j through 73m. The AND-OR element 73f finds the logical product of a single-z signal output from the inverter 73e shown in FIG. 14 and an upper block signal for selecting the cell array 14-2, finds the logical sum of this logical product and a lower block signal for selecting the cell array 14-1, and outputs a result obtained. The same applies to the AND-OR elements 73g through 73i.

The NAND element 73j through 73m inverts the logical product of row address strobe (RAS) activation signal blsz, which goes into the "H" state when an RAS signal used for specifying the row address of a memory cell to be accessed is active, and output from the AND-OR element 73f through 73i and outputs a result obtained.

Now, operation in the third embodiment of the present invention will be described.

(1) Normal Operation

When a tes59z signal is in the "L" state, a single-x signal and single-z signal output from the inverters 73d and 73e respectively go into the "L" state. Therefore, output from the AND elements included in the AND-OR elements 73f through 73i goes into the "L" state regardless of the state of an upper block signal or a lower block signal. As a result, output from each of the AND-OR elements 73f through 73i goes into the "H" state when the upper block signal or the lower block signal input to the OR element is in the "H" state.

For example, when an upper block signal is in the "H" state, output from the AND elements included in the AND-OR elements 73f and 73g goes into the "L" state and output from the AND elements included in the AND-OR elements 73h and 73i also goes into the "L" state. As a result, output from the AND-OR elements 73f and 73g goes into the "L" state and output from the AND-OR elements 73h and 73i goes into the "H" state (see FIG. 16).

On the other hand, when a lower block signal is in the "H" state, output from the AND elements included in the AND-OR elements 73f and 73g goes into the "L" state and output from the AND elements included in the AND-OR elements 73h and 73i also goes into the "L" state. As a result, output from the AND-OR elements 73f and 73g goes into the "H" state and output from the AND-OR elements 73h and 73i goes into the "L" state (see FIG. 16).

It is assumed that when a lower block signal is in the "H" state, RAS activation signal blsz goes into the "H" state. Then output from the NAND elements 73j and 73k goes into the "L" state and output from the NAND elements 73l and 73m goes into the "H" state.

Therefore, in FIG. 13 the transistors T5 and T7 to which a bltlx signal is connected to and the transistors T6 and T8 to which a bltlz signal is connected to go into the ON state and the transistors T1 and T3 to which a bltux signal is connected to and the transistors T2 and T4 to which a bltuz signal is connected to go into the OFF state. As a result, the bit lines on the cell array 14-1 side will be connected to the sense amplifier 71 or 72.

At this time it is assumed that a row address is input and that the word line WL3 is activated. Then cells selected by the word line WL3 are connected to the bit line BL1, BL3, BL5, or BL7 and data read out from these cells will be supplied to the sense amplifier 71 or 72.

On the other hand, when an upper block signal is in the "H" state, data readout from the cell array 14-2 will be supplied to the sense amplifier 71 or 72 via the transistor T1, T2, T3, or T4.

(2) Test Operation

As shown in FIG. 16, when a tes59z signal is in the "H" state, a bltux signal, bltuz signal, bltlx signal, and bltlz signal change according to the state of an extra address signal and selected blocks.

For example, as shown in FIG. 16, when the cell array 14-1 is selected (a lower block signal is in the "H" state) and an extra address signal is put into the "H" state, a bltlz signal alone goes into the "H" state and a bltux signal, bltuz signal, and bltlx signal go into the "L" state.

As a result, the transistors T6 and T8 go into the ON state and the bit lines BL3 and BL7 are connected to the sense amplifiers 71 and 72 respectively.

Figure 17:
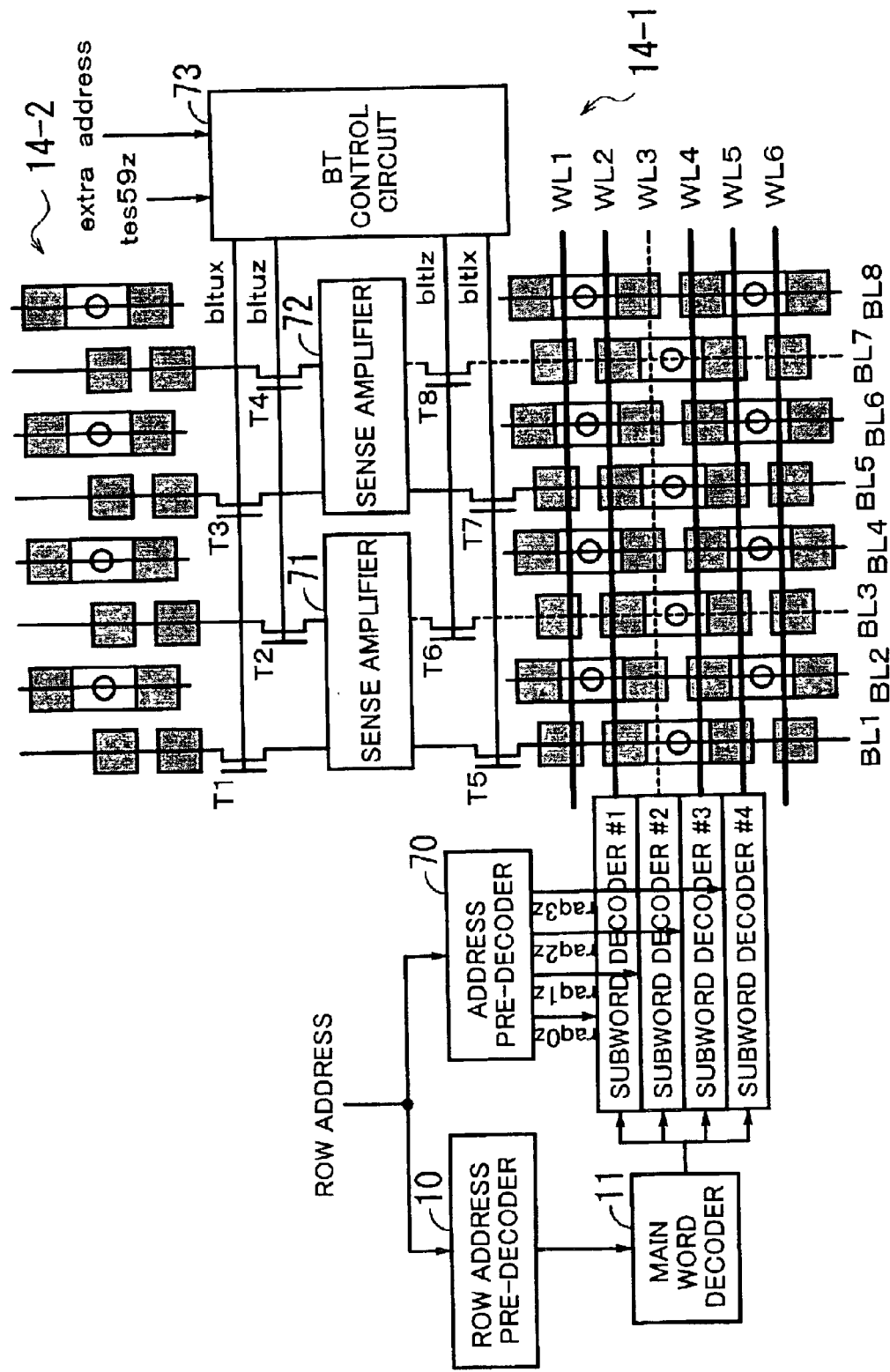
FIG. 17 is a view for describing the operation of the embodiment shown in FIG. 13.

At this time it is assumed that a row address is input and that the word line WL3 has been activated. Then cells selected by the word line WL3 will be connected to the bit line BL3 or BL7. As a result, an operation test can be performed only on one cell (which stores auxiliary data) of a pair cell. FIG. 17 is a view showing a state at this time. In FIG. 17, each activated signal line is indicated by a dashed line.

Figure 18:
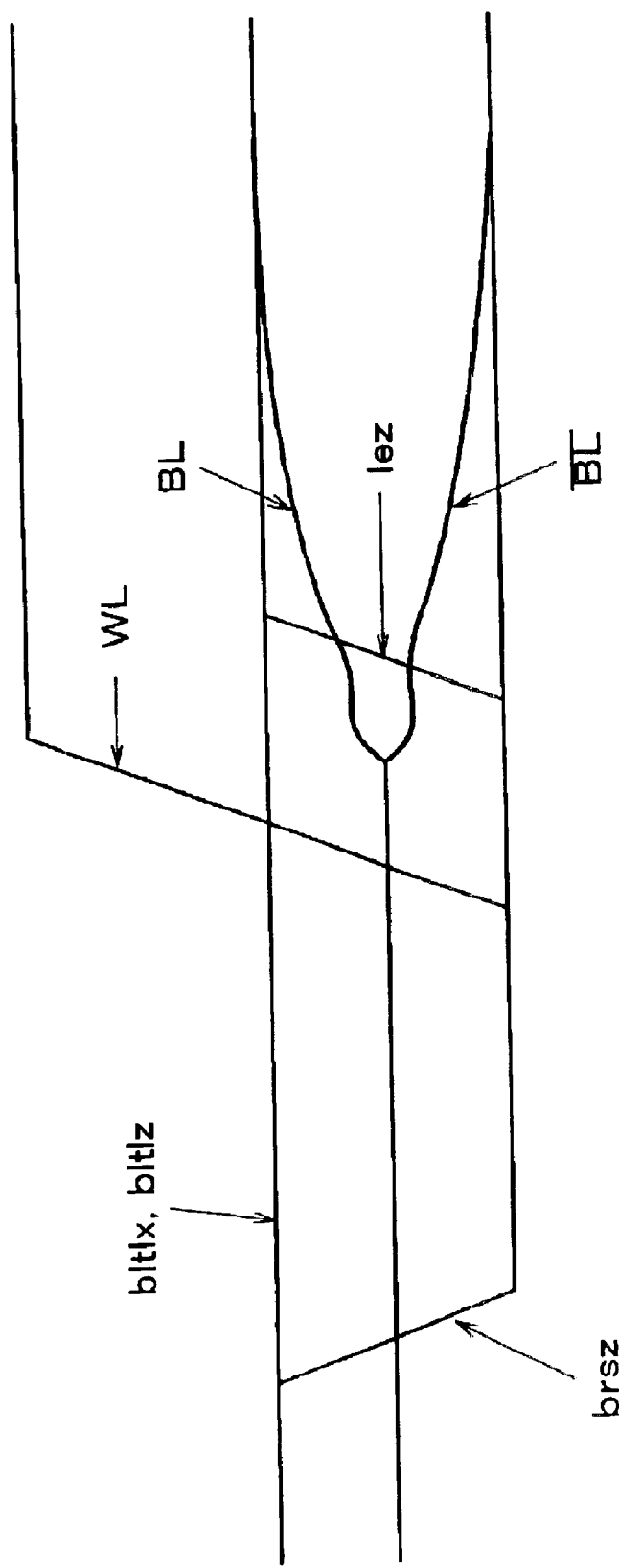
FIG. 18 is a timing chart for describing the operation at normal time of the embodiment shown in FIG. 13.
Figure 19:
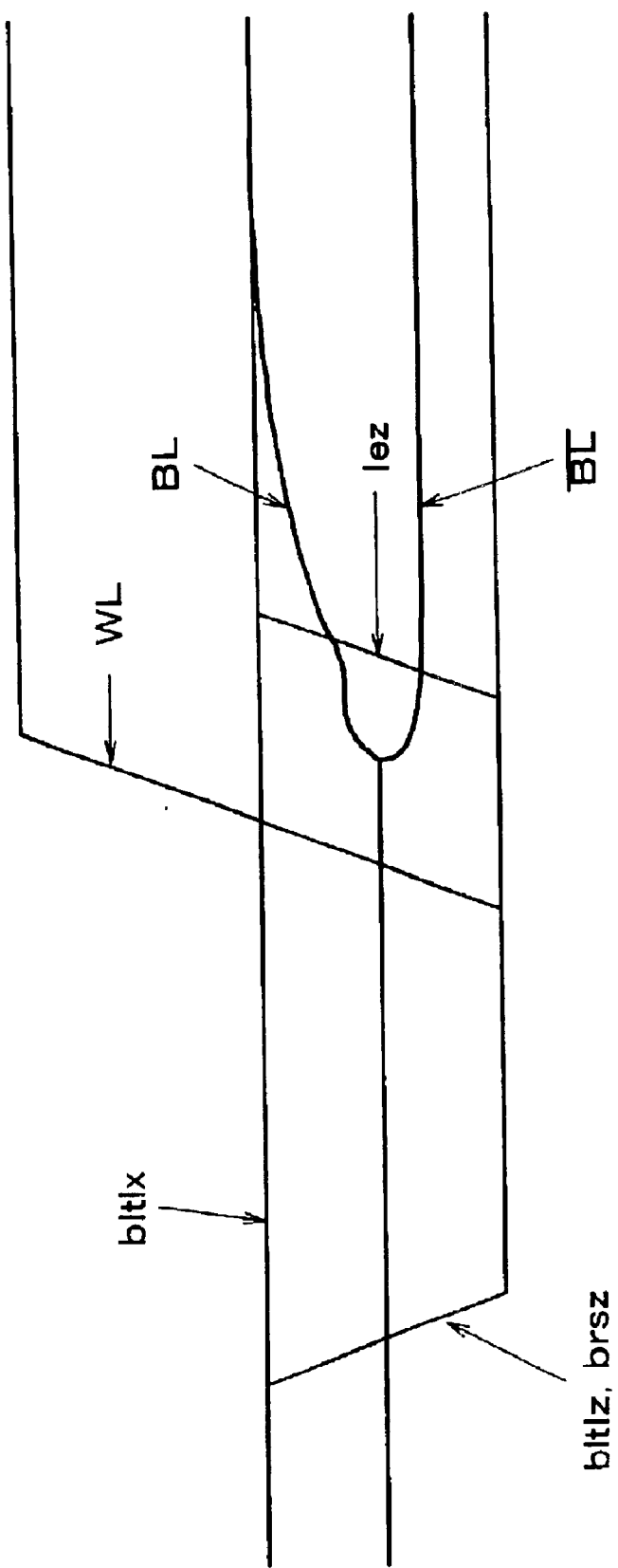
FIG. 19 is a timing chart for describing the operation at operation test time of the embodiment shown in FIG. 13.

FIGS. 18 and 19 are timing charts showing a change in signal in respect to time in the main portion of the third embodiment.

FIG. 18 is a timing chart at normal operation time. In FIG. 18, a bltlx signal and bltlz signal are output from the BT control circuit 73, a brsz signal is a BL equalizing signal, and a lez signal is obtained by delaying a blsz signal by predetermined time. WL, BL, and XBL ($\overline{BL}$) indicate a word line signal, ordinary bit signal, and auxiliary bit signal respectively.

At normal operation time a bltlx signal and bltlz signal keep the "H" state even if a BL equalizing signal goes into the "H" state. The transistors T5 through T8 therefore keep the ON state. A word line WL is made active after a predetermined period of time has elapsed since a brsz signal going into the "L" state. Then data is output from cells and the voltage of an ordinary bit line BL and auxiliary bit line XBL begins to change. When a lez signal for activating the sense amplifiers 71 and 72 goes into the "H" state, the data read out is amplified by the sense amplifier 71 or 72 and is output.

As shown in FIG. 19, at test operation time one of a bltlx signal and bltlz signal goes into the "H" state and the other goes into the "L" state. In this example, a test will be performed on a cell connected to the ordinary bit line. Therefore, the bltlx signal on the ordinary bit line side is put into the "H" state. The bltlz signal is put into the "L" state the moment the brsz signal is activated.

When a certain period of time elapsed after the brsz signal being activated, the word line WL is activated, data is output from the cell connected to the ordinary bit line, and the voltage of the ordinary bit line BL begins to change. On the other hand, data is not output to the auxiliary bit line XBL, so its potential is constant.

When a certain period of time elapsed after the word line WL being activated, the lez signal is put into the "H" state, the sense amplifiers 71 and 72 are activated, and data read out from the ordinary bit line is output.

In the above embodiment an operation test can be performed only on one cell of a pair cell. This is the same with the first and second embodiments.

Moreover, in the third embodiment one word line need only be activated at normal operation time. Therefore, compared with the first and second embodiments in which two word lines must be activated, consumption of power can be reduced.

Now, a fourth embodiment of the present invention will be described.

Figure 20:
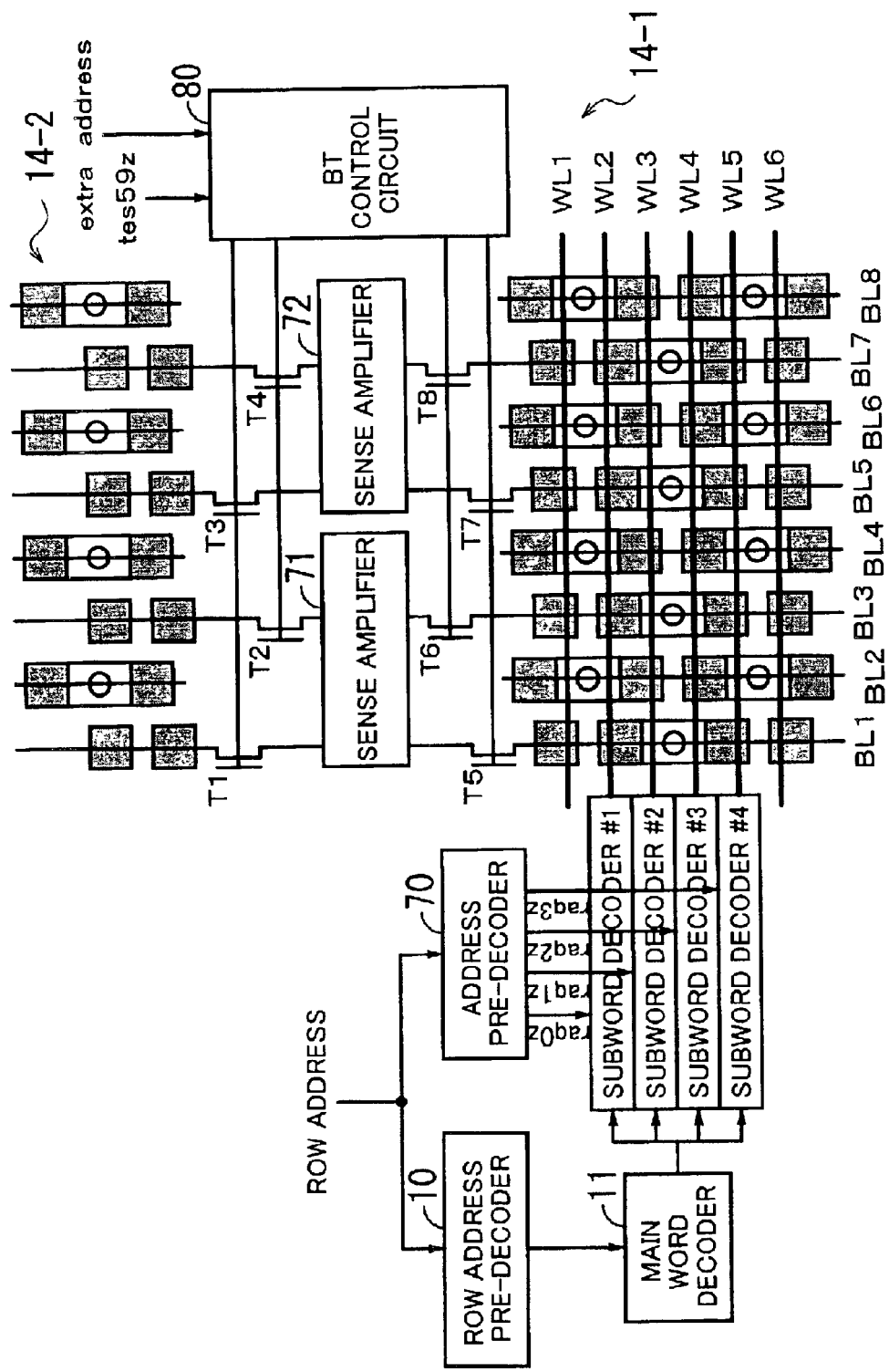
FIG. 20 is a view showing the structure of a fourth embodiment of the present invention.

FIG. 20 is a view showing the structure of a fourth embodiment of the present invention. The structure of the fourth embodiment show in FIG. 20 is the same as that of the third embodiment shown in FIG. 17, except that the BT control circuit 73 is replaced by a BT control circuit 80.

Figure 21:
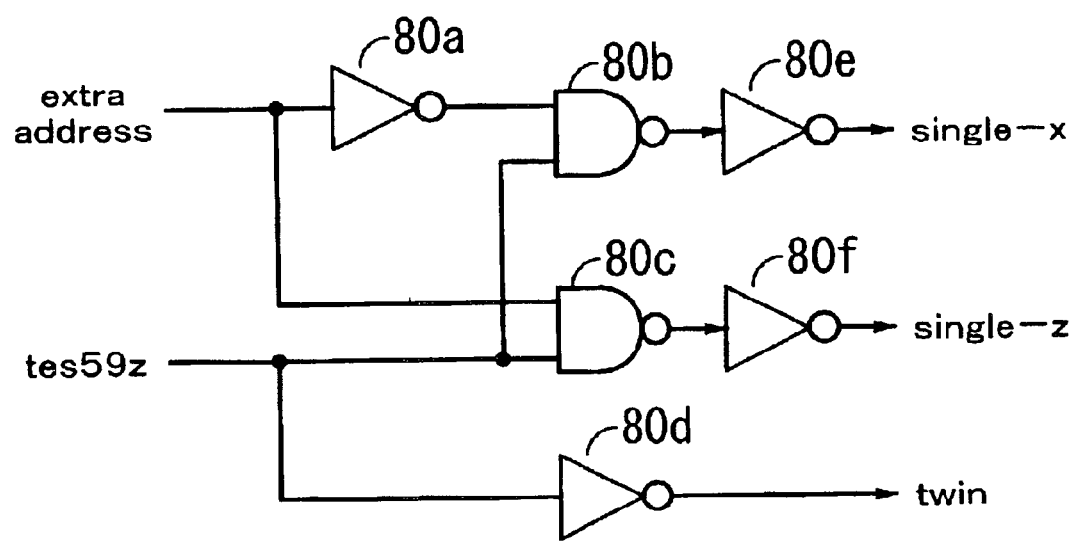
FIG. 21 is a view showing the structure of the BT control circuit shown in FIG. 20.
Figure 22:
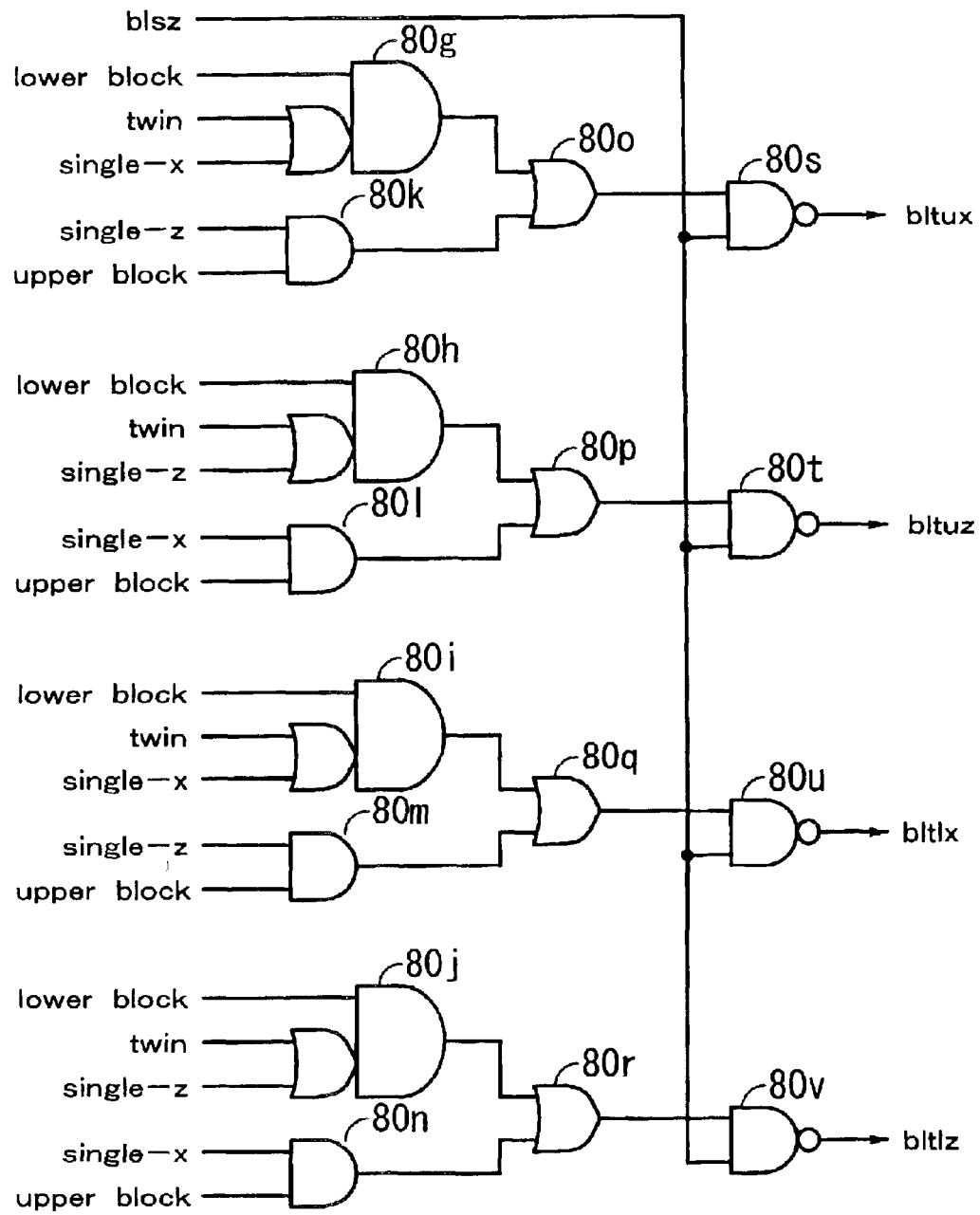
FIG. 22 is a view showing the structure of the BT control circuit shown in FIG. 20.

FIGS. 21 and 22 are views showing the detailed structure of the BT control circuit 80 shown in FIG. 20. A circuit shown in FIG. 21 generates a single-x signal, single-z signal, and twin signal from an extra address signal and tes59z signal. This circuit includes inverters 80a, 80d, 80e, and 80f and NAND elements 80b and 80c.

A circuit shown in FIG. 22 generates a bltux signal, bltuz signal, bltlx signal, and bltlz signal for controlling the transistors T1 through T8 by the use of signals output from the circuit shown in FIG. 21.

This circuit includes OR-AND elements 80g through 80j, AND elements 80k through 80n, OR elements 80o through 80r, and NAND elements 80s through 80v. The OR-AND element 80g finds the logical sum of a single-z signal and twin signal, finds the logical product of this logical sum and an upper block signal, and outputs a result obtained. The same applies to the OR-AND elements 80h through 80j.

The AND element 80k finds the logical product of a single-z signal and upper block signal and outputs a result obtained.

Now, operation in the above embodiment will be described.

(1) Normal Operation

When a tes59z signal is in the "L" state, a single-x signal and single-z signal output from the inverters 80e and 80f respectively go into the "L" state. A twin signal is obtained by inverting the tes59z signal and therefore goes into the "H" state. The single-x signal or the single-z signal is input to one input terminal of each of the AND elements 80k through 80n shown in FIG. 22, so its output will go into the "L" state regardless of the state of a signal input to the other input terminal. Out put from each AND element 80k through 80n therefore goes into the "L" state.

On the other hand, the twin signal is input to one input terminal of an OR element included in each OR-AND element 80g through 80j, so its output will go into the "H" state regardless of the state of a signal input to the other input terminal. Therefore, output from each OR-AND element 80g through 80j goes into the "H" state in the case of a signal directly input to its AND element being in the "H" state and goes into the "L" state in the case of a signal directly input to its AND element being in the "L" state.

As a result, output from the OR element 80o goes into the "H" state in the case of a signal directly input to the AND element of the OR-AND element 80g being in the "H" state and goes into the "L" state in the case of a signal directly input to the AND element of the OR-AND element 80g being in the "L" state. The same applies to the OR elements 80p through 80r.

It is assumed that the cell array 14-1 is selected and that a lower block signal is in the "H" state. Then output from the OR elements 80o and 80p goes into the "H" state and output from the NAND elements 80s and 80t goes into the "L" state. On the other hand, output from the OR elements 80q and 80r goes into the "L" state and output from the NAND elements 80u and 80v goes into the "H" state.

As a result, when a blsz signal goes into the "H" state, a bltlz signal and bltlx signal go into the "H" state and a bltux signal and bltuz signal go into the "L" state. FIG. 23 is a view showing the relations among the state of a tes59z signal, a selected block, the state of an extra address signal, a bltux signal, a bltuz signal, a bltlx signal, and a bltlz signal.

When the bltlz signal and bltlx signal go into the "H" state in this way, the transistors T5 through T8 go into the ON state and the cell array 14-1 is connected to the sense amplifiers 71 and 72. In this state of things it is assumed that the word line WL3 is activated. Then cells selected by the word line WL3 will be connected to the bit line BL1, BL3, BL5, and BL7.

On the other hand, if an upper block signal is in the "H" state, then data read out from the cell array 14-2 will be supplied via the transistors T1 through T4 to the sense amplifiers 71 and 72.

(2) Test Operation

As shown in FIG. 23, when a tes59z signal is in the "H" state, a bltux signal, bltuz signal, bltlx signal, and bltlz signal change according to the state of an extra address signal and selected blocks.

For example, when the cell array 14-1 is selected (a lower block signal is in the "H" state) and an extra address signal is put into the "L" state, a single-x signal, single-z signal, and twin signal go into the "H" state, "L" state, and "L" state respectively. Therefore, as shown in FIG. 23, a bltuz signal and bltlx signal go into the "H" state and a bltux signal and bltlz signal go into the "L" state.

As a result, the transistors T2, T4, T5, and T7 go into the ON state and the bit lines BL1 and BL5 and the corresponding bit lines in the cell array 14-2 will be connected to the sense amplifier 71 or 72.

At this time it is assumed that a row address is input and that the word line WL3 has been activated. Then cells selected by the word line WL3 will be connected to the bit line BL1 or BL5. As a result, an operation test can be performed only on one cell (which stores auxiliary data) of a pair cell.

Figure 24:
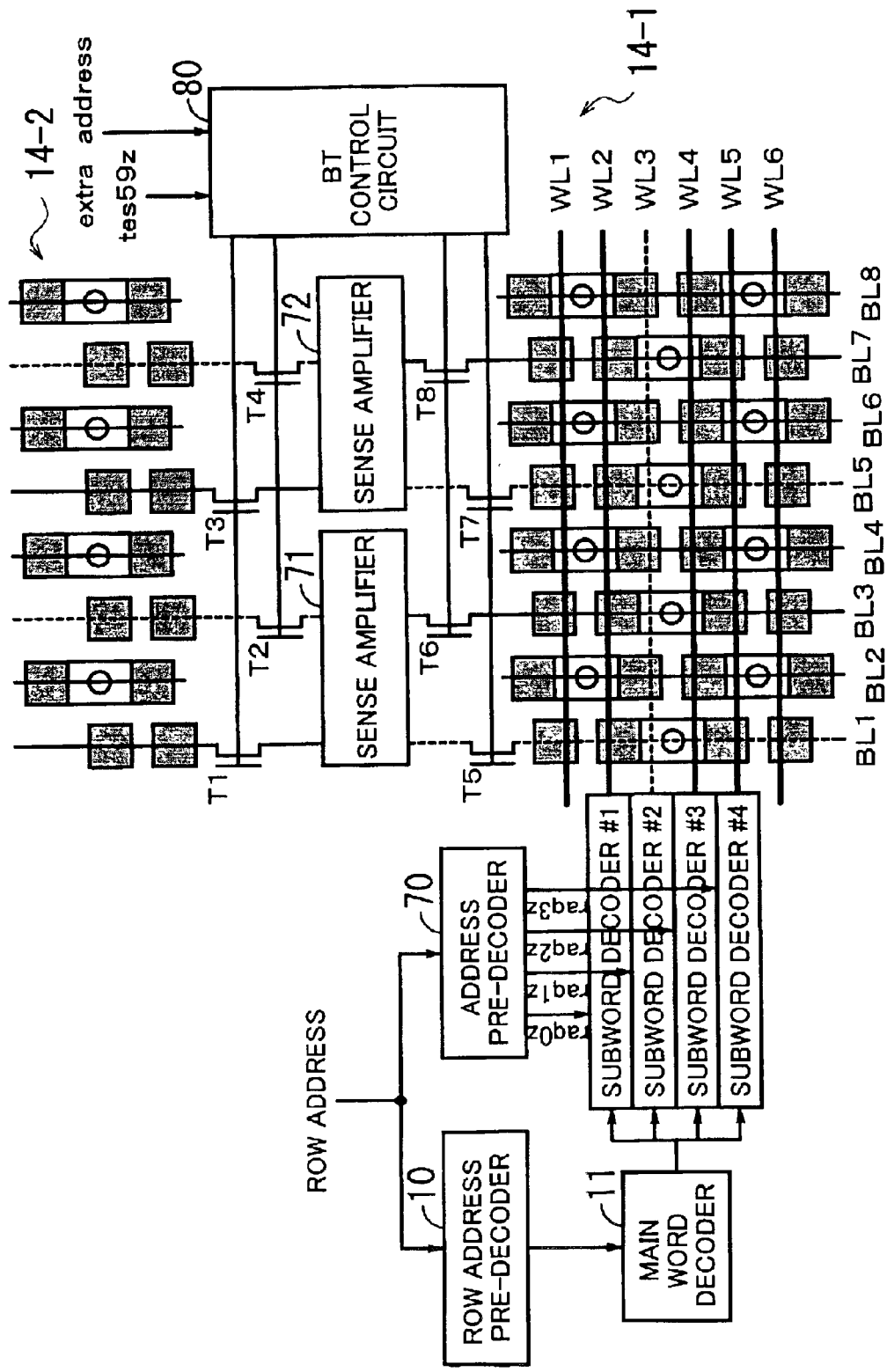
FIG. 24 is a view for describing the operation of the embodiment shown in FIG. 20.

A word line WL on the cell array 14-2 is not activated, so the cell array 14-2 is not connected to a bit line. However, bit lines are connected to the sense amplifiers 71 and 72. This prevents loads on the sense amplifiers 71 and 72 from losing a balance between the ordinary bit line side and auxiliary bit line side. FIG. 24 is a view showing the state described above. Each dashed line in FIG. 24 indicates an activated signal line.

In the above embodiment an operation test can be performed only on one cell of a pair cell. This is the same with the third embodiment.

Moreover, in the fourth embodiment one word line need only be activated at normal operation time. Therefore, compared with the first and second embodiments in which two word lines must be activated, consumption of power can be reduced.

Furthermore, in the fourth embodiment bit lines BL (for example, ordinary bit lines if auxiliary bit lines are selected), which are on a cell array not selected and which are opposite to bit lines on a cell array selected, are also connected to the sense amplifier 71 or 72. This prevents loads on the sense amplifiers 71 and 72 from losing a balance and therefore prevents a malfunction.

The number of cell arrays to be controlled is only one, so it is difficult to balance loads on cell amplifiers located around a group of cell arrays by the technique shown in FIG. 20. However, a capacitor having predetermined capacitance may be located on the side where a cell array does not exist, and be connected in place of bit lines. This will make it possible to balance loads on cell amplifiers located around a group of cell arrays.

Now, a fifth embodiment of the present invention will be described.

Figure 25:
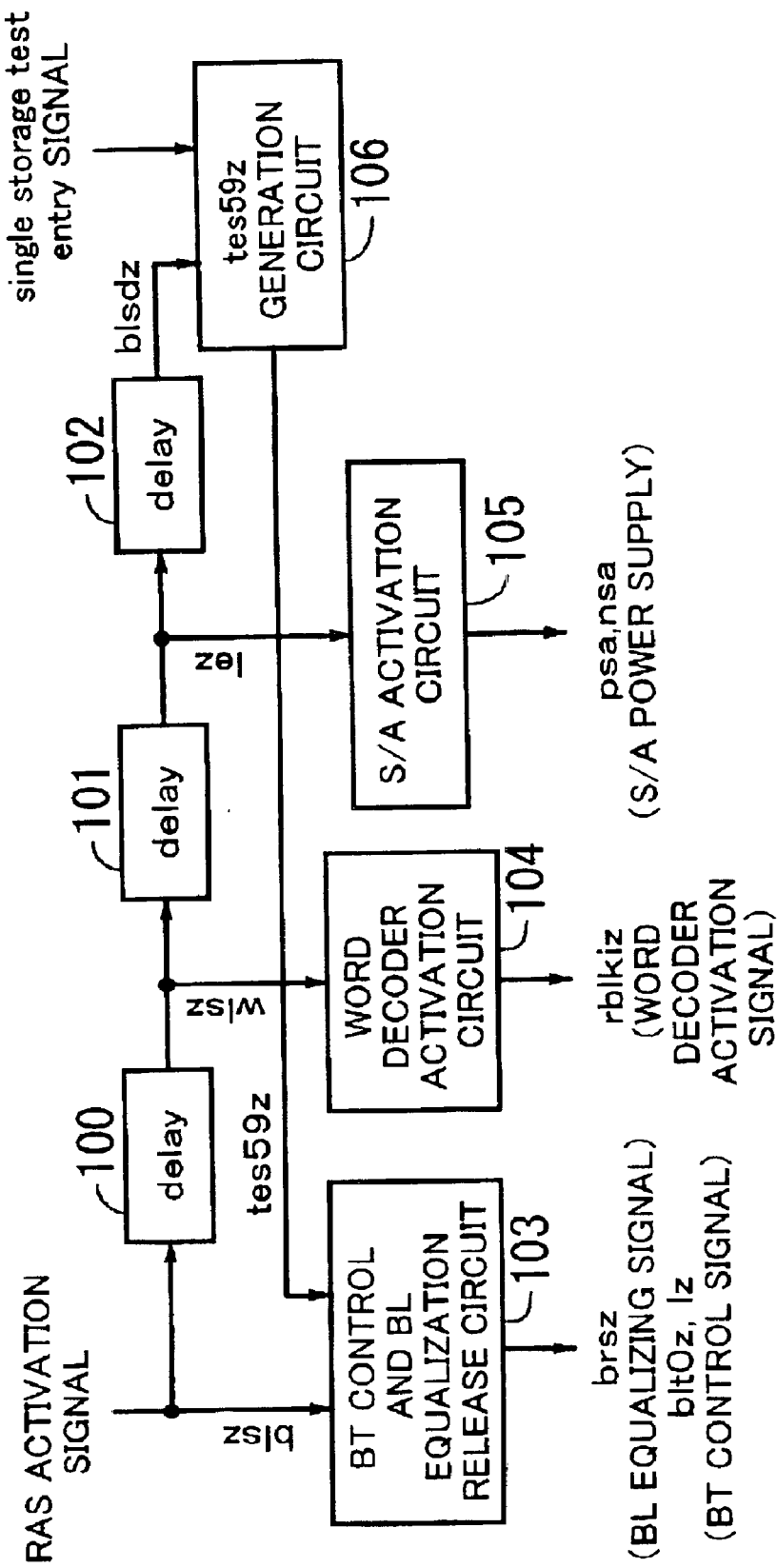
FIG. 25 is a view showing the structure of a fifth embodiment of the present invention.

FIG. 25 is a view showing the structure of a fifth embodiment of the present invention. A circuit shown in FIG. 25 is a RAS activation circuit and includes delay circuits 100 through 102, a BT control and BL equalization release circuit 103, a word decoder activation circuit 104, an S/A activation circuit 105, and a tes59z generation circuit 106.

Each of the delay circuits 100 through 102 inputs a blsz signal, being a RAS activation signal, delays it by predetermined time, and outputs it.

The BT control and BL equalization release circuit 103 inputs a blsz signal and tes59z signal, generates a brsz signal, being a BL equalizing signal, a blt0z signal, being a BT control signal, and an lz signal, being a BT control signal, and outputs them.

The word decoder activation circuit 104 inputs a wlsz signal output from the delay circuit 100 and outputs an rblkiz signal, being a word decoder activation signal.

The S/A activation circuit 105 inputs an lez signal output from the delay circuit 101, generates psa and nsa, being power supply for sense amplifiers (S/A), and outputs them.

The tes59z generation circuit 106 accepts a single storage test entry signal and a blsdz signal output from the delay circuit 102, generates a tes59z signal, and outputs it.

Figure 26:
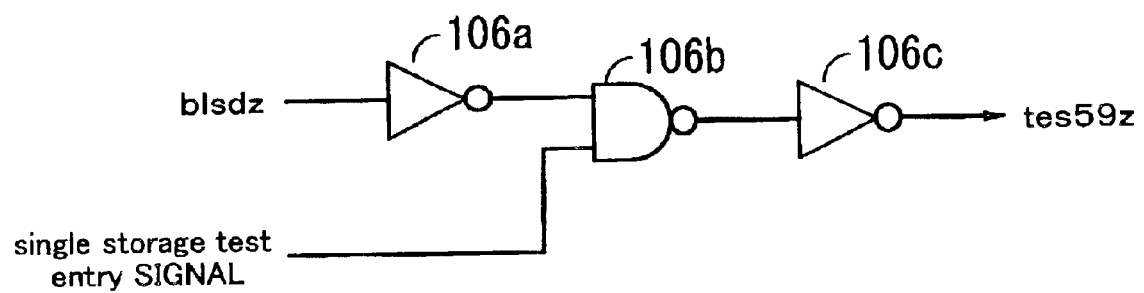
FIG. 26 is a view showing the detailed structure of the tes59z generation circuit shown in FIG. 25.
Figure 27:
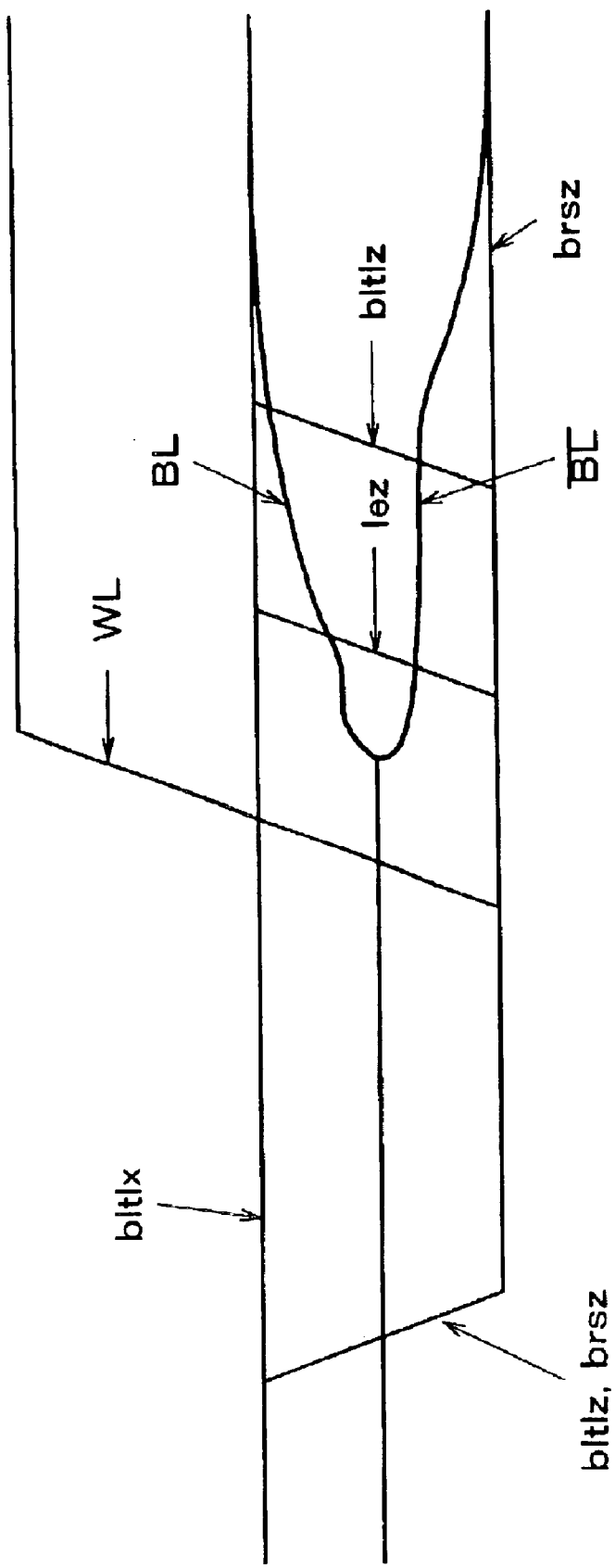
FIG. 27 is a timing chart for describing the operation of the embodiment shown in FIG. 25.
Figure 28:
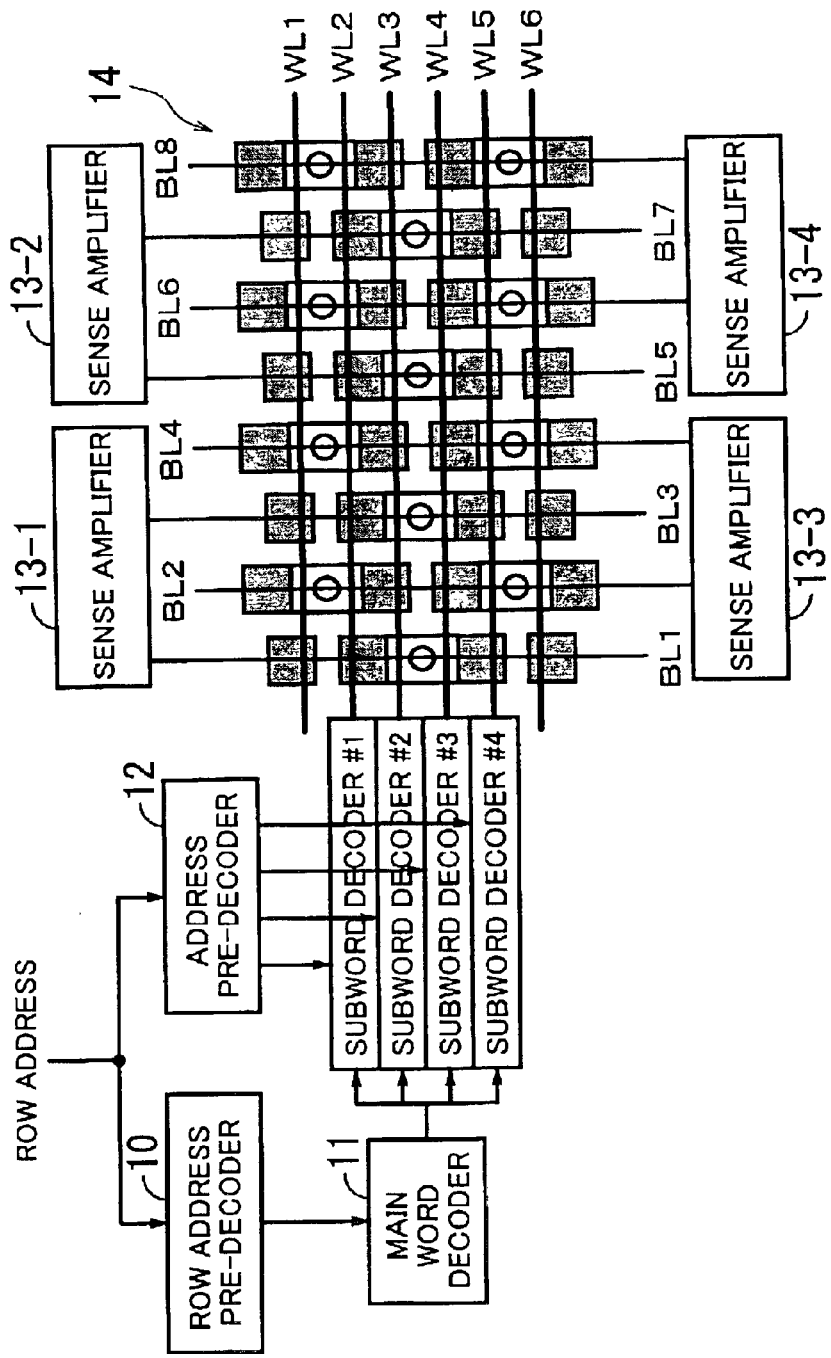
FIG. 28 is a view showing the structure of a conventional semiconductor memory device.
Figure 29:
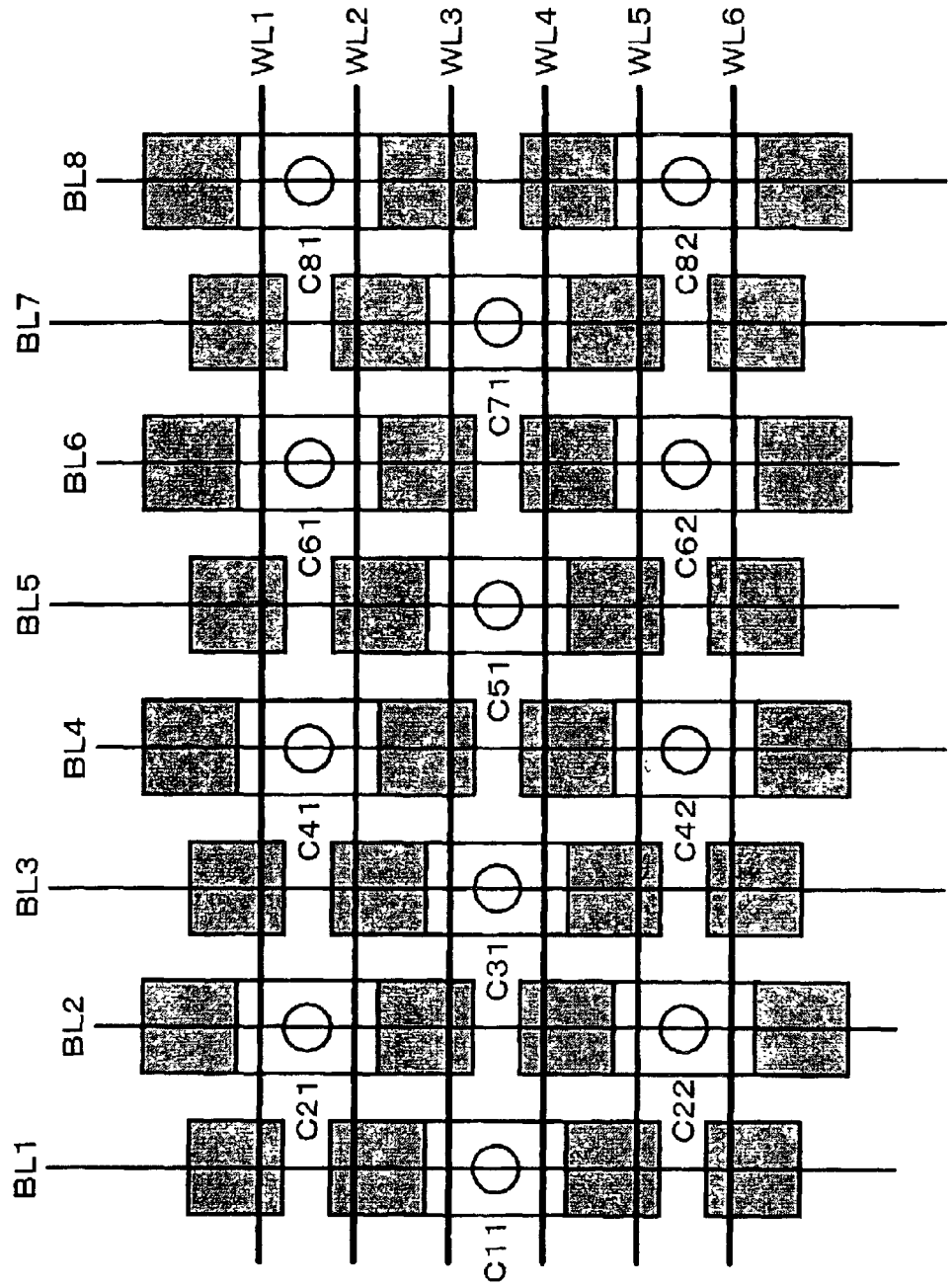
FIG. 29 is a view showing the detailed structure of the cell array shown in FIG. 28.
Figure 30:
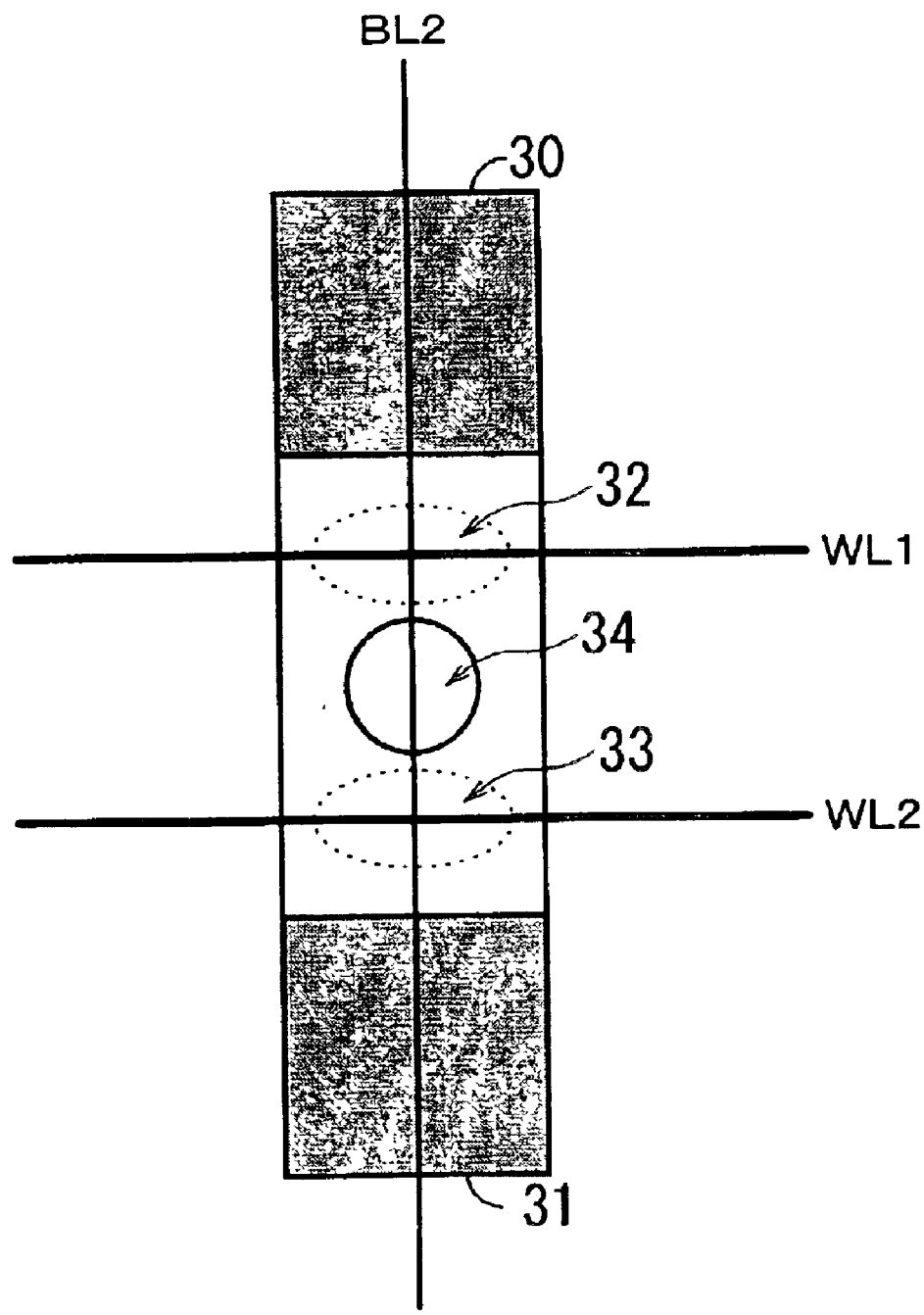
FIG. 30 is a view showing the detailed structure of the cell units shown in FIG. 29.

FIG. 26 is a view showing the detailed structure of the tes59z generation circuit 106. As shown in FIG. 26, the tes59z generation circuit 106 includes inverters 106a and 106c and a NAND element 106b. The tes59z generation circuit 106 generates a tes59z signal from a blsdz signal output from the delay circuit 102 and a single storage test entry signal and outputs it.

Now, operation in the above embodiment will be described.

By the way, in the third and fourth embodiments of the present invention data in a cell to which attention is not paid (for example, if there are a pair of cells which connect with a bltlz signal and data stored only in one cell is to be read out, the other cell is a cell to which attention is not paid) is output to a bit line BL when a word line WL is activated. This output data will appear as minute potential fluctuations on the bit line BL. However, transistors are in the OFF state, so such data output to a bit line BL will not be amplified by the sense amplifier 71 or 72. Electric charges in the cell will not be restored, resulting in the loss of the data.

In the fifth embodiment of the present invention data is rewritten from the sense amplifier 71 or 72 to a cell in such a case so that the data will not be lost.

To be concrete, a result output from a logic gate by inputting a single storage test entry signal and blsdz signal as shown in FIG. 26 is input as a tes59z signal to the circuits shown in FIGS. 14 and 21 in place of the terminals in FIGS. 14 and 21 to which a single storage test entry signal is directly input (terminals to which a tes59z signal is input).

As shown in FIG. 25, a blsdz signal is generated by delaying RAS activation signal blsz which goes into the "H" state while a RAS signal is active by the use of the delay circuits 100 through 102. First, the sense amplifiers 71 and 72 put the transistors on the side of a block not selected into the OFF state and release BL equalization. Then a word line WL is activated. When data appears on a bit line BL, power is supplied to the sense amplifiers 71 and 72 and amplification operation is begun.

A blsdz signal output from the delay circuit 102 goes into the "H" state a certain period of time after the sense amplifiers 71 and 72 begin amplification operation. Therefore, setting should be performed so that this blsdz signal will go into the "H" state when data is amplified in some degree after the beginning of the amplification operation (for example, when a potential difference corresponding to 50 percent of full restore is generated on an ordinary bit line BL or an auxiliary bit line XBL). Moreover, setting should be performed so that the blsdz signal will return to the "L" state soon after the RAS signal is reset (made inactive).

If setting is performed in this way, a tes59z signal will go into the "L" state toward the end of the amplification operation by the sense amplifiers 71 and 72 and switching to a twin storage operation mode will be performed.

As stated above, amplification is begun by an lez signal in a state in which a bit line BL alone is connected. When data is amplified in some degree after a while, a tes59z signal goes into the "L" state. Then a bltlx signal returns to the "H" state (switching to a normal operation mode is performed) and data amplified by the sense amplifiers is rewritten to an auxiliary bit line XBL. As a result, only data on an ordinary bit line BL can be amplified and tested without losing data on the auxiliary bit line XBL side.

The above structure prevents data stored in one cell of a pair cell from being lost when data stored in the other cell is read out. As a result, for example, after test data is written to all the cells, data stored in an ordinary bit cell and auxiliary bit cell can be read out and checked in that order by incrementing (or decrementing) an address. This enables quick operation tests.

The circuits shown in the above embodiments are examples. It is a matter of course that the present invention is not limited to such cases.

As has been described in the foregoing, a semiconductor memory device having a plurality of pair cells including a pair of cells for storing ordinary data and auxiliary data, according to the present invention, comprises word lines for selecting a predetermined pair cell, bit lines for reading data from and writing data to a pair cell selected by the word lines, an operation mode input circuit for accepting a setting signal input to set an operation mode, and a restriction circuit for putting restrictions on reading data from and writing data to one cell of the pair cell in the case of a setting signal indicative of setting to a mode in which an operation test is performed on a cell being input from the operation mode input circuit. Therefore, the operation of only one cell of a pair cell can be checked and the reliability of semiconductor memory devices can be improved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device having a plurality of pair cells including a pair of cells for storing ordinary data and auxiliary data, the memory comprising:

word lines for selecting a predetermined pair cell;

bit lines for reading data from and writing data to a pair cell selected by the word lines;

an operation mode input circuit for accepting a setting signal input to set an operation mode; and a restriction circuit for putting restrictions on reading data from and writing data to one cell of the pair cell in the case of a setting signal indicative of setting to a mode in which an operation test is performed on a cell being input from the operation mode input circuit.

2. The semiconductor memory device according to claim 1, wherein:

the word lines include a word line for a cell for ordinary data of the pair cell and a word line for a cell for auxiliary data of the pair cell which are located independently of each other; and the restriction circuit puts restrictions on reading and writing by stopping activation of either of the word line for the cell for ordinary data and the word line for the cell for auxiliary data which are located independently of each other in the case of being set to the mode in which an operation test is performed.

3. The semiconductor memory device according to claim 2, wherein the word line for the cell for ordinary data in the pair cell and the word line for the cell for auxiliary data in the pair cell are juxtaposed.

4. The semiconductor memory device according to claim 2, wherein the word line for the cell for ordinary data in the pair cell and the word line for the cell for auxiliary data in the pair cell are located alternately.

5. The semiconductor memory device according to claim 1, wherein the restriction circuit puts restrictions on reading data from and writing data to one cell of the pair cell by disconnecting either bit line from the pair cell.

6. The semiconductor memory device according to claim 5, wherein:

each of the bit lines has a semiconductor switch; and the restriction circuit puts restrictions on reading data from and writing data to one cell of the pair cell by turning the semiconductor switch to ON or OFF.

7. The semiconductor memory device according to claim 5, wherein the pair cell is selected by one word line.

8. The semiconductor memory device according to claim 5, wherein a plurality of cell arrays each including a plurality of pair cells are included; and data is read and written by the cell array.

9. The semiconductor memory device according to claim 8, further comprising sense amplifiers for amplifying data read from or written to each of pair cells included in two adjacent cell arrays, wherein the restriction circuit puts restrictions on reading data from and writing data to one cell of a pair cell by disconnecting all bit lines connected to one of the two adjacent cell arrays and by disconnecting either bit line from the pair cell in the other cell array.

10. The semiconductor memory device according to claim 8, further comprising sense amplifiers for amplifying data read from or written to each of pair cells included in two adjacent cell arrays, wherein the restriction circuit puts restrictions on reading data from and writing data to one cell of a pair cell by disconnecting one bit line from a pair cell in one of the two adjacent cell arrays on which an operation test is to be performed and by disconnecting the other bit line from a pair cell in the other of the two adjacent cell arrays on which an operation test is not to be performed.

11. The semiconductor memory device according to claim 9, wherein a capacitor having the same capacitance as a bit line is connected as a load to a cell amplifier which controls only one cell array.

12. The semiconductor memory device according to claim 5, wherein read data is rewritten to a cell from which the bit line was disconnected.

* * * * *